United States Patent
Xing et al.

(10) Patent No.: US 11,422,282 B2
(45) Date of Patent: Aug. 23, 2022

(54) CIRCULAR POLARIZATION CORRECTION IN NUCLEAR MAGNETIC RESONANCE (NMR) LOGGING

(71) Applicant: Halliburton Energy Services, Inc., Houston, TX (US)

(72) Inventors: Yunzhao Xing, Kingwood, TX (US); Rebecca Corina Jachmann, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 373 days.

(21) Appl. No.: 16/795,311

(22) Filed: Feb. 19, 2020

(65) Prior Publication Data
US 2020/0319367 A1    Oct. 8, 2020

Related U.S. Application Data

(63) Continuation of application No. PCT/US2019/026109, filed on Apr. 5, 2019.

(51) Int. Cl.
*G01V 3/32*     (2006.01)
*G01N 24/08*    (2006.01)
(Continued)

(52) U.S. Cl.
CPC .............. *G01V 3/32* (2013.01); *E21B 47/002* (2020.05); *G01N 24/081* (2013.01); *G01R 33/3678* (2013.01); *G01R 33/3808* (2013.01)

(58) Field of Classification Search
CPC ............ G01R 33/3678; G01R 33/3808; G01N 24/081; G01V 3/32; E21B 47/002
See application file for complete search history.

(56) References Cited

U.S. PATENT DOCUMENTS

| 4,707,664 A | 11/1987 | Fehn et al. |
| 6,781,371 B2 | 8/2004 | Taherian et al. |

(Continued)

FOREIGN PATENT DOCUMENTS

| EP | 0455418 A2 | 11/1991 |
| EP | 0967490 A1 | 12/1999 |

(Continued)

OTHER PUBLICATIONS

U.S. Appl. No. 16/798,396; Notice of Allowance; dated Feb. 1, 2021, 10 pages.

(Continued)

*Primary Examiner* — Gregory H Curran
(74) *Attorney, Agent, or Firm* — Delizio, Peacock, Lewin & Guerra

(57) ABSTRACT

A method for nuclear magnetic resonance (NMR) logging is disclosed that pulses, using a quadrature antenna of an NMR logging tool in a borehole, a circularly polarized (CP) signal into a formation surrounding the borehole. The method also pulses, using the quadrature antenna, a reverse circularly polarized (RCP) signal into the formation. A sensor of the NMR logging tool detects a first NMR signal from the formation in response to the RCP pulses and a second NMR signal from the formation in response to the CP pulses. A correct transverse magnetization value is then recovered based, at least in part, on the first NMR signal and the second NMR signal.

20 Claims, 14 Drawing Sheets

(51) Int. Cl.
*G01R 33/36* (2006.01)
*G01R 33/38* (2006.01)
*E21B 47/002* (2012.01)

(56) References Cited

U.S. PATENT DOCUMENTS

| | | | |
|---|---|---|---|
| 7,193,414 | B2 | 3/2007 | Kruspe et al. |
| 7,649,353 | B2 | 1/2010 | Feiweier et al. |
| 7,714,581 | B2 | 5/2010 | Erickson et al. |
| 8,294,461 | B2 | 10/2012 | Overall et al. |
| 8,319,496 | B2 | 11/2012 | Eryaman et al. |
| 8,466,683 | B2 | 6/2013 | Legendre et al. |
| 8,674,695 | B2 | 3/2014 | Wiggins |
| 9,201,159 | B2 | 12/2015 | Morys et al. |
| 9,377,557 | B2 | 6/2016 | Reiderman |
| 9,632,204 | B2 | 4/2017 | Jachmann et al. |
| 9,562,989 | B2 | 5/2017 | Conrad et al. |
| 9,658,358 | B2 | 5/2017 | Hürlimann et al. |
| 2003/0052677 | A1 | 3/2003 | Pines et al. |
| 2004/0066192 | A1 | 4/2004 | Heidler |
| 2010/0179763 | A1* | 7/2010 | Overall .............. G01R 33/246 324/309 |
| 2010/0249572 | A1* | 9/2010 | Weiss ................. G01R 33/287 600/410 |
| 2010/0253338 | A1 | 10/2010 | Eryaman et al. |
| 2012/0212074 | A1 | 8/2012 | Uchida et al. |
| 2013/0234704 | A1 | 9/2013 | Hurlimann et al. |
| 2015/0061665 | A1 | 3/2015 | Reiderman et al. |
| 2015/0323698 | A1 | 11/2015 | Mandal et al. |
| 2016/0266272 | A1 | 9/2016 | Jachmann et al. |
| 2017/0254919 | A1 | 9/2017 | Coman et al. |
| 2018/0003852 | A1 | 1/2018 | Jachmann et al. |
| 2020/0319372 | A1 | 10/2020 | Jachmann et al. |

FOREIGN PATENT DOCUMENTS

| | | |
|---|---|---|
| WO | 2016164441 A1 | 10/2016 |
| WO | 2020204944 A1 | 10/2020 |
| WO | 2020204947 A1 | 10/2020 |

OTHER PUBLICATIONS

Vaidya, et al., "Dependence of B 1 + and B 1—Field Patterns of Surface Coils on the Electrical Properties of the Sample and the MR Operating Frequency", Concepts Magn Reson Part B Magn Reson Eng. (Year: 2016) ; Pub. Date Oct. 27, 2016, 30 pages.
U.S. Appl. No. 16/798,396, Non-Final Office Action, dated Jul. 1, 2020, 25 pages.
Hammer, "MRI Physics: Pulse Sequences", 2014, 13 pages.
PCT Application Serial No. PCT/US2019/026104, International Search Report, dated Jan. 3, 2020, 3 pages.
PCT Application Serial No. PCT/US2019/026104, International Written Opinion, dated Jan. 3, 2020, 7 pages.
PCT Application Serial No. PCT/US2019/026109, International Search Report, dated Jan. 3, 2020, 4 pages.
PCT Application Serial No. PCT/US2019/026109, International Written Opinion, dated Jan. 3, 2020, 7 pages.
Blanz, et al., "Nuclear Magnetic Resonance Logging While Drilling (NMR-LWD): From an Experiment to a Day-to-Day Service for the Oil Industry", diffusion-fundamentals.org 14 (2010) 2, pp. 1-5.
Freude, "Nuclear Magnetic Resonance", Spectroscopy, Nov. 2006, 29 pages.

* cited by examiner

CIRCULAR POLARIZATION CORRECTION IN NUCLEAR MAGNETIC RESONANCE (NMR) LOGGING

TECHNICAL FIELD

The disclosure generally relates to the field of downhole Nuclear Magnetic Resonance (NMR) logging, more particularly to circular polarization correction in NMR logging.

BACKGROUND

In the field of logging (e.g. wireline logging, logging while drilling (LWD) and measurement while drilling (MWD)), NMR tools have been used to explore the subsurface based on the magnetic interactions with subsurface material. By tuning a radio frequency (RF) pulse to the correct or selected frequency, a resonant response can be elicited from hydrogen in formation materials. NMR logging can provide meaningful measurements of a variety of petrophysical variables, including hydrogen porosity. Hydrogen porosity, when considered alongside other characteristics determined via NMR logging, may correspond to hydrocarbon porosity, allowing the detection and characterization of hydrocarbons in surrounding formations through NMR logging. However, multiple factors and physical effects may cause noise, error, or deviation from measurements under ideal conditions. These may include factors such as high temperature, downhole materials altering antenna coil Q-factors, misalignment of antennas, or effects such as the Bloch-Siegert shift.

BRIEF DESCRIPTION OF THE DRAWINGS

Embodiments of the disclosure may be better understood by referencing the accompanying drawings.

DESCRIPTION OF EMBODIMENTS

Figure 1:
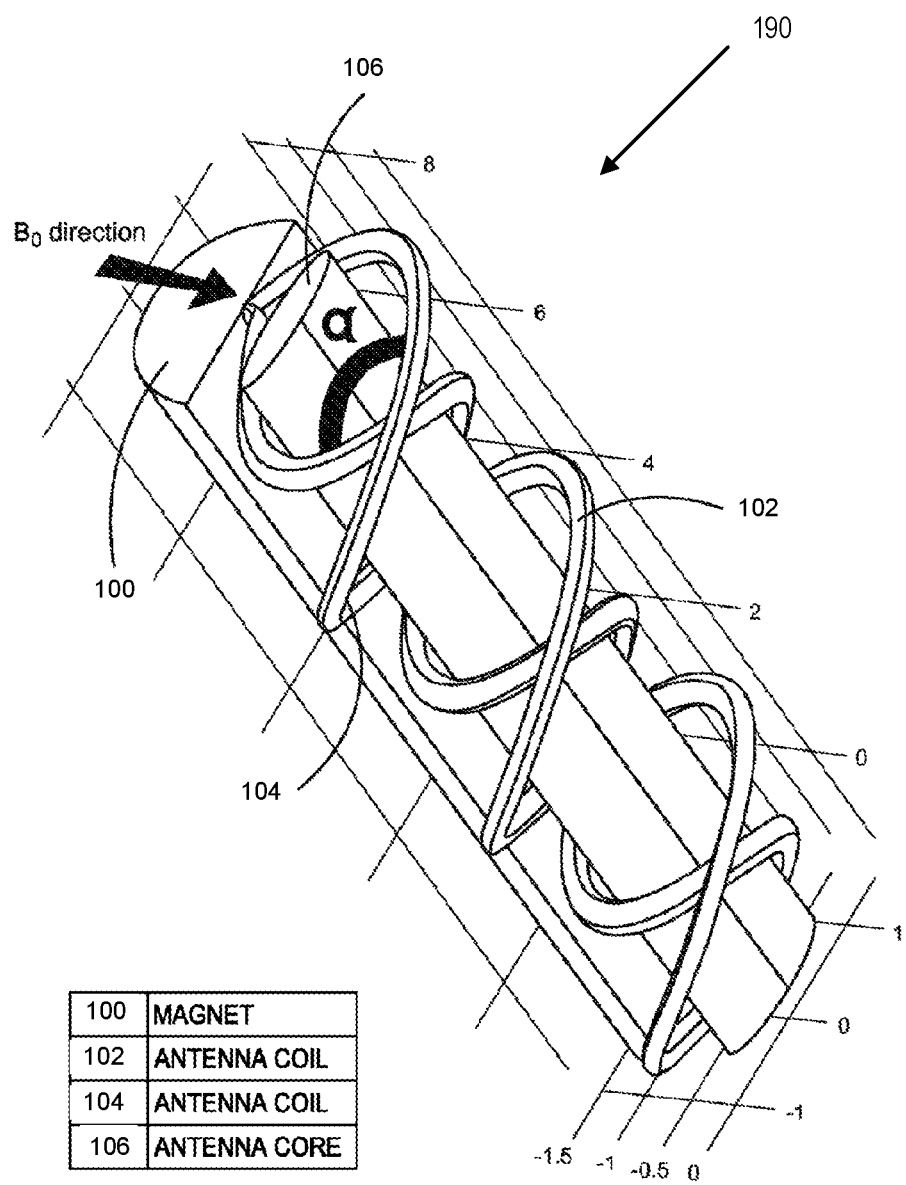
FIG. 1 illustrates an example configuration of antenna windings, magnet, and core that may be employed in an NMR logging tool, according to some embodiments.

The description that follows includes example systems, methods, techniques, and program flows that embody embodiments of the disclosure. However, it is understood that this disclosure may be practiced without these specific details. For instance, this disclosure refers to nuclear magnetic resonance in illustrative examples. Aspects of this disclosure can be applied to other types of resonances (e.g., electron paramagnetic resonance).

Various embodiments include circular polarization-based downhole NMR logging. In some embodiments, reverse circularly polarized (RCP) pulses are used to correct NMR results due to the deviations of circularly polarized (CP) pulses from the ideal (i.e., a 90° pulse which maximizes transverse magnetization). To illustrate, for NMR downhole operations, Ultra-Short (US) pulses can be key in implementing $T_2$ sequences. However, US pulses suffer from the pulse strength rivaling that of the static magnetic field. Thus, the experimental conditions reside outside of the rotating wave approximation. Circular polarization (CP) can be used to eliminate the counter rotating polarized field present in linear polarization which causes such effects as Bloch-Siegert and other high order issues.

To use CP and RCP pulses for downhole NMR logging, quadrature antennas with multiple coils may be used for transmission and receipt. However, if the status of any coil in a quadrature antenna changes unexpectedly, the CP pulse generated by the antenna may be distorted, thereby affecting the measurement results significantly. For example, a quadrature antenna with dual coils can generate elliptical polarization pulses when one of the coils generates a smaller pulse amplitude than the other. This can introduce error to the measured total magnetization. Therefore, for NMR applications which may require a large number of rapid measurements, a fast and reliable calibration of quadrature antennas improves the quality of generated CP pulses.

The quality of generated CP pulses can be affected by several factors, including the geometry of each coil, the positioning of coils in an antenna, the Q factor of each coil, the pulse amplitude, phase applied to each coil, etc. To check and calibrate each of these factors can be a tedious and complicated task. Unfortunately, some of these factors can be significantly affected by environmental effects, especially under downhole conditions. This may increase the difficulty of calibrating each of the factors above.

For example, when the electronic components of a transmitter experience a high temperature environment, pulse amplitude will vary due to the variation of the electronic properties of electronic components due to temperature. The performance variation of each transmitter depends on the specific electronic components and may differ for each transmitter, thus creating imperfections in CP pulses due to differences among the amplitudes of each pulse.

Additionally, in LWD tools, some parts of the antenna may be exposed to or covered in mud during drilling procedures and thus vary the Q factor of coils unexpectedly, which can distort CP pulses. A non-uniform formation about a tool antenna may also vary the Q factor of coils and distort CP pulses. Additionally, the noise and ringing of electronic circuits often mix with signals which is difficult to separate directly. Conventionally, the noise level can be estimated by phase shifting and the ringing level can be estimated and partially canceled by using phase alteration pulses (PAP).

By using RCP pulses from a quadrature antenna, the calibration of NMR signals can be accurate, and it is possible to derive a correct transverse magnetization magnitude of an NMR signal from uncalibrated measurements. This process avoids alternate calibration schemes and can be used on data during or after measurement to correct for imperfections in CP pulses from a quadrature antenna.

Example Quadrature Antennas

Figure 2:
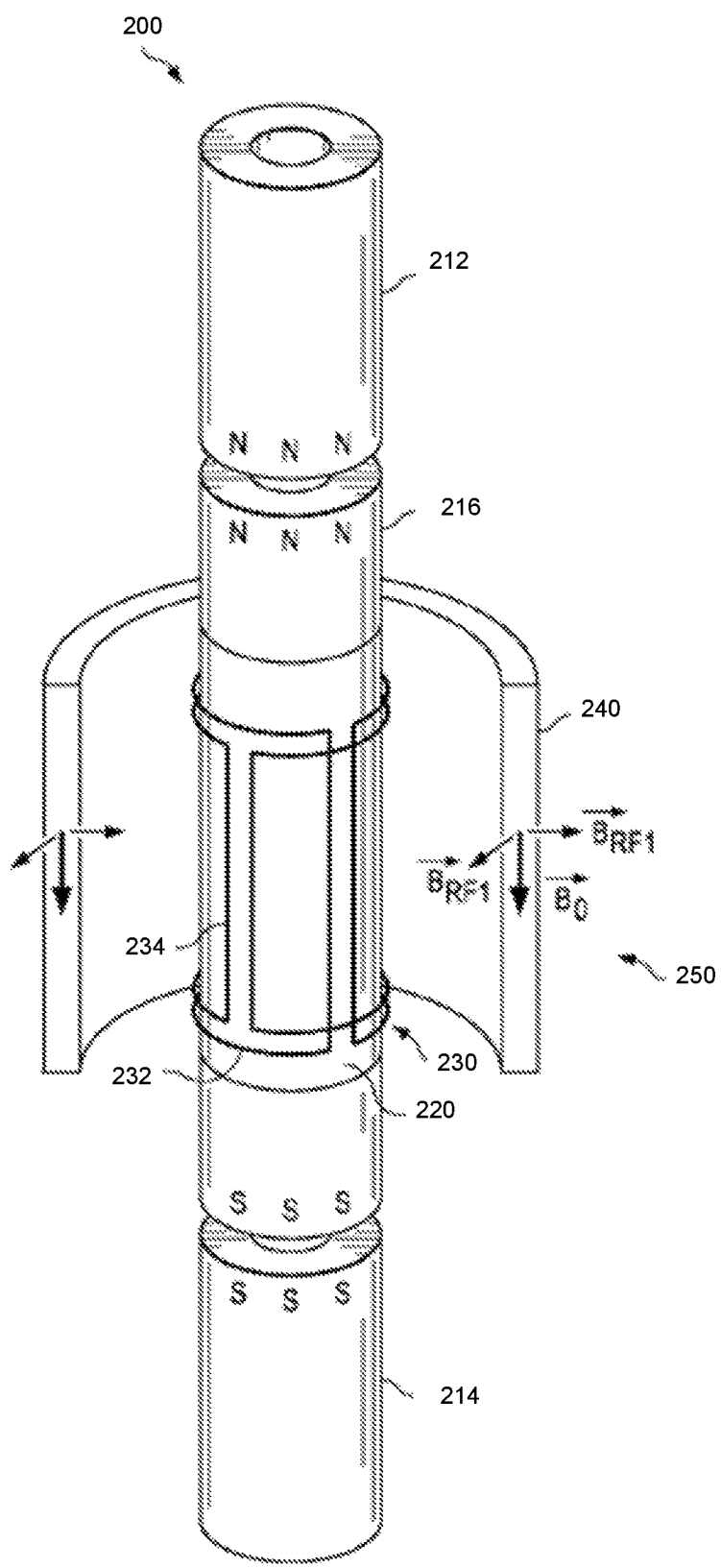
FIG. 2 depicts an NMR logging tool with an example quadrature antenna having a magnet assembly, according to some embodiments.

FIGS. 1 and 2 depict two different example quadrature antennas. FIG. 1 illustrates an example configuration of antenna windings, magnet, and core that may be employed in an NMR logging tool, according to some embodiments. An NMR logging tool 190 includes an elongated permanent magnet 100. The magnet 100 has a generally semi-circular outline in cross section but in other examples can have another suitable cross-sectional shape. In use, the magnet 100 generates a "main magnetic field" or "static field" $B_0$ in the direction generally indicated by the arrow $B_0$ in the view. This direction is substantially perpendicular to the longitudinal axis of the magnet 100 and will typically lie in the direction of the intended measurements to be taken by the NMR tool 190. The longitudinal axis of the magnet 100 may align with or be parallel to the longitudinal axis of the NMR logging tool 190 in which the magnet 100 is placed.

Positioned adjacent the magnet 100 is a first antenna coil 102 and a second antenna coil 104, which are wrapped around a common antenna core 106. The turns of the antenna coils 102 and 104 lie neither in the plane of the tool axis or the tool cross section. Further, the turns of the first and second antenna coils 102 and 104 are unaligned with either a longitudinal axis of the tool or an orthogonal axis substantially transverse thereto. In contradistinction, in conventional tools, the longitudinal axis of a conventional antenna coil is aligned either with the longitudinal axis of the tool in which the coil is fitted, or orthogonal to the longitudinal axis (a transverse axis). The turns of conventional antenna coils are, therefore, substantially in alignment with the longitudinal or transverse axis or in alignment with planes extending in the directions of these axes. The turns of conventional coils may be characterized as slightly out of alignment with the main axes (or planes in these directions) by dint of the helical or spiral configuration of the conventional coils. However, this supposed misalignment is not appreciable and the effect of separating the turns of the antenna coils by an optimum angle has not been appreciated.

In some embodiments, the turns in one antenna coil may be separated from corresponding turns in the second oppositely wound antenna coil by an angle ($\alpha$). This angle of separation may exist between turns of overlapping coils or turns of separate coils. Thus, instead of the insignificant or unrecognized misalignment of coil turns of conventional NMR tools, the angle ($\alpha$) may, in some embodiments, be in the range of 20 to 160 degrees, or 70 to 110 degrees. In some embodiments, the angle ($\alpha$) of separation exceeds 90 degrees.

In some embodiments, the first and second antenna coils 102 and 104 have a common longitudinal axis and are wound around a common antenna core, such as the core 106. The first antenna coil 102 includes a spirally wound coil configuration around the common antenna core 106, and the second antenna coil 104 may include an oppositely wound spiral configuration around the common antenna core 106. The spiral coil configurations may be generally as shown in FIG. 1, but other coil configurations are possible. Example dimensions of the antenna windings, magnet, and core configuration are given by the illustrated dimension grid. For example, the overall length of the configuration may be approximately eight inches, the width approximately two inches, and the depth (in the view) approximately one and a half inches.

In use, the first antenna coil 102 may be energized by radio frequency power having a 90-degree phase difference from radio frequency power energizing the second antenna coil 104, such that the NMR logging tool 190 generates a circularly polarized RF magnetic field.

FIG. 2 depicts an NMR logging tool with an example quadrature antenna having a magnet assembly, according to some embodiments. FIG. 2 depicts an NMR logging tool 200. The NMR logging tool 200 includes a magnet assembly that generates a static magnetic field to produce polarization, and an antenna assembly that (a) generates a radio frequency (RF) magnetic field to generate excitation, and (b) acquires NMR signals. In the example shown in FIG. 1, the magnet assembly that includes the end piece magnets 212, 214 and a central magnet 216 generates the static magnetic field in the volume of investigation 240. In the volume of investigation 240, the direction of the static magnetic field (shown as the solid black arrow 250) is parallel to the longitudinal axis of the wellbore. In some examples, a magnet configuration with double pole strength can be used to increase the strength of the magnetic field (e.g., up to 100-150 Gauss or higher in some instances). In the example shown in FIG. 2, the antenna assembly 230 includes two mutually orthogonal transversal-dipole antennas 232, 234. In some instances, the NMR logging tool 200 can be implemented with a single transversal-dipole antenna. For example, one of the transversal-dipole antennas 232, 234 may be omitted from the antenna assembly 230. The example transversal-dipole antennas 232, 234 shown in FIG. 2 are placed on an outer surface of a soft magnetic core 220, which is used for RF magnetic flux concentration. The static magnetic field can be axially symmetric (or substantially axially symmetric), and therefore may not require broader band excitation associated with additional energy loss. The volume of investigation can be made axially long enough and thick enough (e.g., 20 centimeters (cm) long, and 0.5 cm thick in some environments) to provide immunity or otherwise decrease sensitivity to axial motion, lateral motion, or both. A longer sensitivity region can enable measurement while tripping the drill string. The sensitivity region can be shaped by shaping the magnets 212, 214, 216 and the soft magnetic material of the core 220. In some implementations, the antenna assembly 230 additionally or alternatively includes an integrated coil set that performs the operations of the two transversal-dipole antennas 232, 234. For example, the integrated coil may be used (e.g., instead of the two transversal-dipole antennas 232, 234) to produce circular polarization and perform quadrature coil detection. Examples of integrated coil sets that can be adapted to perform such operations include multi-coil or complex single-coil arrangements, such as, for example, birdcage coils commonly used for high-field magnetic resonance imaging (MRI). Compared to some example axially-symmetrical designs, the use of the longitudinal-dipole magnet and the transversal dipole antenna assembly also has an advantage of less eddy current losses in the formation and drilling fluid (i.e., "mud") in the wellbore due to a longer eddy current path than for some longitudinal-dipole antenna(s). In some embodiments, NMR measurements over multiple subvolumes can increase the data density and therefore signal-to-noise ratio ("SNR") per unit time. Multiple volume measurements in a static magnetic field having a radial gradient can be achieved, for example, by acquiring NMR data on a second frequency while waiting for nuclear magnetization to recover (e.g., after a CPMG pulse train) on a first frequency. A number of different frequencies can be used to run a multi-frequency NMR acquisition involving a number of excitation volumes with a different depth of investigation. In addition to higher SNR, the multi-frequency measurements can also enable profiling the fluid invasion in the wellbore, enabling a better assessment of permeability of earth formations. Another way to conduct multi-volume measurements is to use different regions of the magnet assembly to acquire an NMR signal. NMR measurements of these different regions can be run at the same time (e.g., simultaneously) or at different times.

Example CP/RCP Pulses

Figure 3:
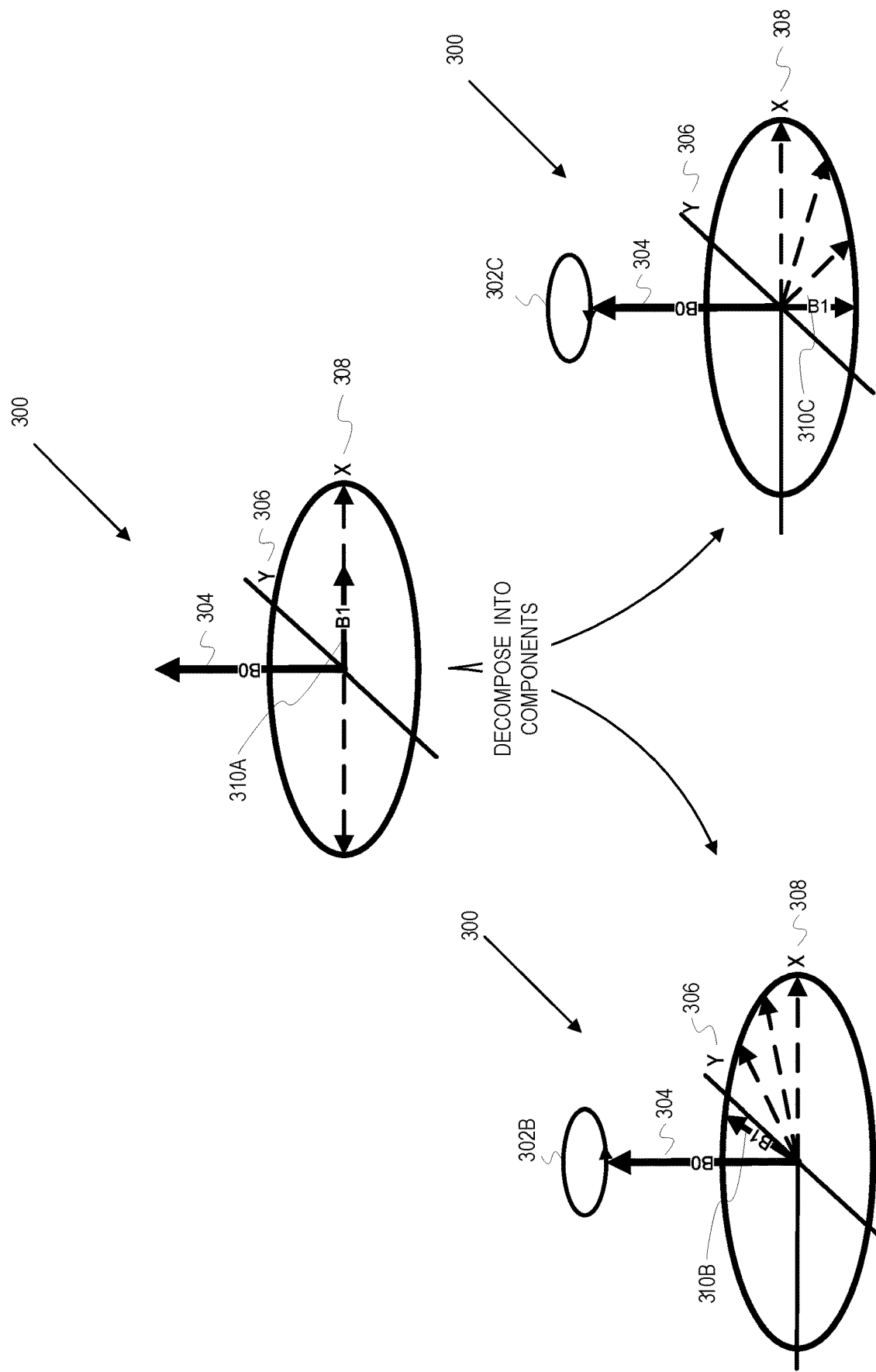
FIG. 3 depicts a constant static magnetic field, a linear polarized oscillating magnetic field during a singular antenna pulse, and two counter rotating magnetic fields the linear polarized oscillating magnetic field mathematically decomposes into.

FIG. 3 depicts a constant static magnetic field, a linear polarized oscillating magnetic field during a singular antenna pulse, and two counter rotating magnetic fields mathematically decomposed from the linear polarized oscillating magnetic field. FIG. 3 depicts the fluctuation of magnetic fields in response to a pulse. A pulse is a time limited event used in modern NMR techniques. A pulse is a single vibration or short burst of sound, electric current, light, or another wave. Magnetic fields are created during a portion of time in which the pulse occurs. FIG. 3 depicts a reference frame 300. The reference frame 300 has a y-axis 306 and an x-axis 308. FIG. 3 depicts the perpendicular components of a linearly polarized oscillating magnetic field ($B_1$) 310A created by the pulse from the antenna at the static magnetic field ($B_0$) 304. The x- and y-plane is determined by the static magnetic field ($B_0$) 304, which is defined to be the z-axis. The x- and y-axes are determined in the case shown for the x-axis to be aligned with the perpendicular portion of the oscillating magnetic field herein called B1 field and the y-axis to be perpendicular to both x-axis and z-axis. The linearly polarized oscillating magnetic field 310A can be decomposed into two counter rotating magnetic fields, 310B and 310C. The axis of rotation is determined by the static magnetic field. The rotating magnetic fields 310B-C are the components of the linearly polarized oscillating magnetic field ($B_1$) 310A that are perpendicular to the static magnetic field ($B_0$) 304 along the axes 308 and 306. The direction of rotation for 310B-C is shown by arrow 302B and 302C with an angular velocity equal to a Larmor frequency. The Larmor frequency is given by Equation (1):

$$\omega_0 = -\gamma B_0 \quad (1)$$

$\gamma$ is the gyromagnetic ratio of a substance and $B_0$ is the static magnetic field magnitude. The static magnetic field 304 is produced by a permanent magnet for NMR logging tools. The gyromagnetic ratio $\gamma$ is known for different nuclei and atoms, including hydrogen and various other ions which are the primary subjects of NMR logging.

The varying magnetic field ($B_1$) 310A is depicted orthogonal to the y-axis 306 and parallel to the x-axis 308. The varying magnetic field 310A (along the dashed line) oscillates between positive and negative values of the x-axis 308 and has zero angular velocity in the x-y plane. The varying magnetic field 310A is equivalent to the sum of two rotating components 310B and 310C. Both components rotate in the x-y plane, at the same frequency, but in opposite directions. The varying magnetic fields 310B, 310C oscillate in both the x-axis 308 and the y-axis 306.

A component rotating in the same direction as the spin precession is the resonant component. A component rotating opposite to the spin precession is the non-resonant component. Varying magnetic field 310B represents the resonant component of varying magnetic field 310A while varying magnetic field 310C represents the non-resonant component. The varying magnetic field 310A precesses at the Larmor frequency. The varying magnetic field 310A oscillates along the x-axis 308 with an amplitude $2b_1$. This may be rewritten as a superposition of two waves oscillating clockwise and counterclockwise about the z-axis as depicted by the varying magnetic field 310C and the varying magnetic field 310B, respectively. The linearly polarized oscillating magnetic field is given by Equation (2):

$$B_{1_{linear}} = \quad (2)$$
$$2|b_1|\cos(\omega_{ref}t + \varphi_p)e_x = |b_1|(\cos(\omega_{ref}t + \varphi_p)e_x + \sin(\omega_{ref}t + \varphi_p)e_y + \cos(\omega_{ref}t + \varphi_p)e_x - \sin(\omega_{ref}t + \varphi_p)e_y)$$

Under ordinary circumstances, the non-resonant component 310B has almost no influence on the motion of the spins while the resonant component 310C has strong interaction with the spins. The non-resonant component influence is on the order of $(B_1/2B_0)^2$, which is known as the Bloch-Siegert shift. A resonant component (as depicted by the varying field 310C) of the varying magnetic field is given by Equation (3):

$$B_{1,resonant}(t) = b_1 \cos(\omega_{ref}t+\varphi_p)e_x + b_1 \sin(\omega_{ref}t+\varphi_p)e_y \quad (3)$$

A non-resonant component (as depicted by the varying field 310B) is given by Equation (4):

$$B_{1,non-resonant}(t) = b_1 \cos(\omega_{ref}t+\varphi_p)e_x - b_1 \sin(\omega_{ref}t+\varphi_p)e_y \quad (4)$$

$B_{1,resonant}$ and $B_{1,non-resonant}$ are the varying magnetic fields 310C and 310B, respectively. $b_1$ is the amplitude of $B_{1,resonant}$ and $B_{1,non-resonant}$, $\omega_{ref}$ is the angular frequency of the reference frame (e.g., the rotation 302), and $\varphi_p$ is the initial phase of the varying magnetic fields 310B and 310C. The varying magnetic field 310A can be expressed as a sum of the varying magnetic fields 310B and 310C. Similarly, CP and RCP pulses can create the clockwise and counterclockwise rotating fields as demonstrated from the linear pulses, however, for a 2 antenna system, where the antenna are perpendicular, the counter rotating field and clockwise rotating fields are created independently from each other. When pulsed at the same time the two antennae create a dual antenna pulse.

CP pulses and RCP pulses may also be referred to as resonant pulses and non-resonant pulses, respectively, due to their influence on substances in NMR target volumes. It is convenient to use resonant and non-resonant pulses for fields like NMR, where resonant and non-resonant pulses have distinct effects. In NMR, resonant pulses influence total magnetization of target substances while non-resonant pulses have minimal effect on total magnetization.

Figure 4:
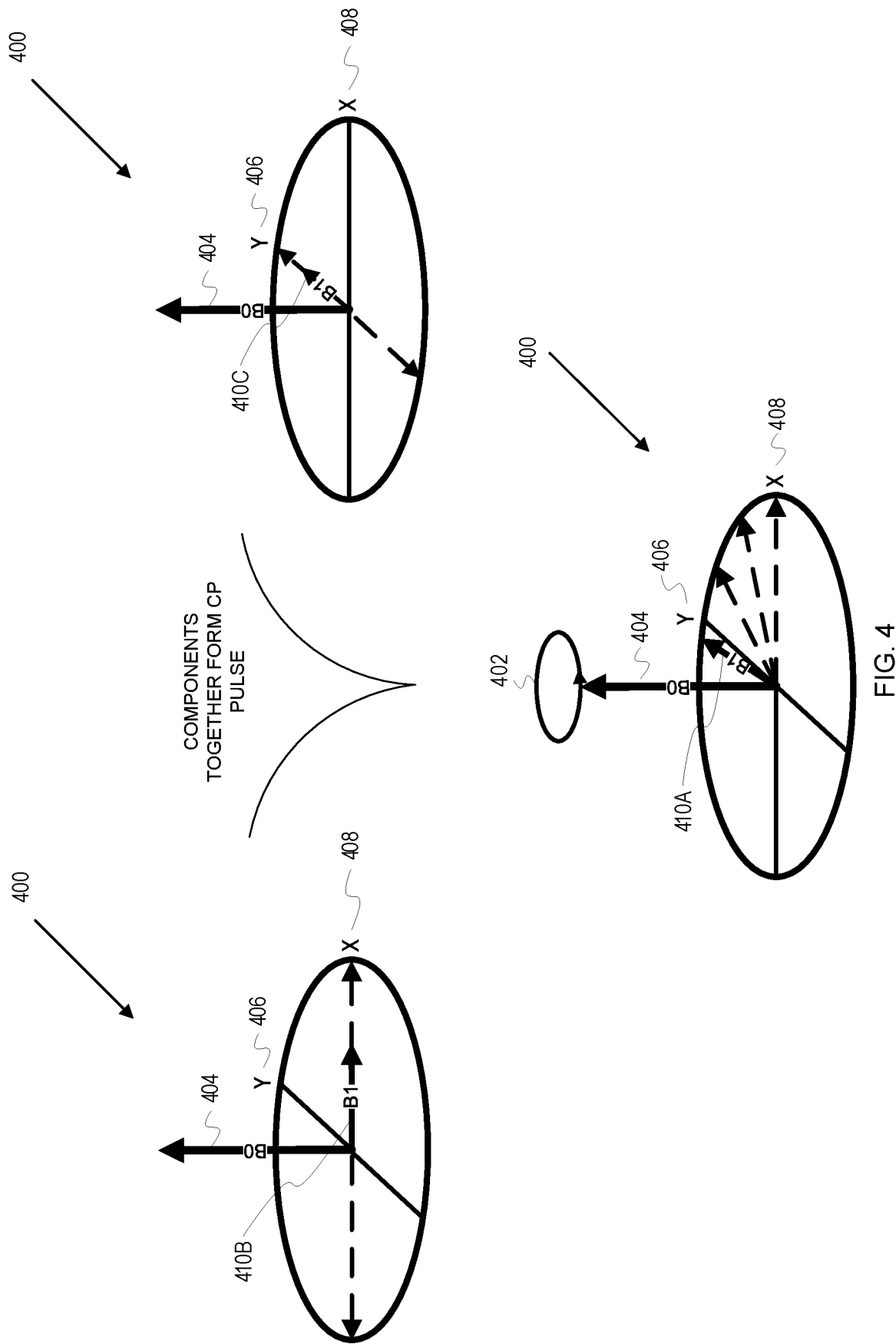
FIG. 4 depicts a constant static magnetic field, two linearly polarized oscillating magnetic fields along different axes during a dual antenna pulse, and a circularly polarized oscillating magnetic field composed from the two linearly polarized oscillating magnetic fields.

FIG. 4 depicts a constant static magnetic field, two linearly polarized oscillating magnetic fields along different axes during a dual antenna pulse, and a circularly polarized oscillating magnetic field composed from the two linearly polarized oscillating magnetic fields. FIG. 4 depicts a reference frame 400. The reference frame 400 has a y-axis 406 and an x-axis 408. The x-axis 408 and y-axis 406 are perpendicular to a static magnetic field ($B_0$) 404, in the transversal plane to $B_0$. The rotationally varying magnetic field 410A precesses about a circle in the x-y plane (as indicated by the dashed lines). The direction of rotation of the rotationally varying magnetic field 410A is indicated by arrow 402. Linearly polarized magnetic fields 410B, 410C oscillate along the x-axis 408 and the y-axis 406, respectively. The rotationally varying magnetic field 410A is composed of the two varying magnetic fields 410B and 410C. This is represented mathematically by Equations (5)-(7). A CP pulse is created by the combination of varying magnetic fields along separate axes in conjunction with the static magnetic field and turning on the field for limited amounts of time. The x-component (represented in FIG. 4 by 410B) of a CP pulse is given rotationally by Equation (5):

$$B1_x(t) = B1\cos(\omega_{ref}t+\varphi_{p_1})e_x = 2b_1\cos(\omega_{ref}t+\varphi_{p_1})e_x. \quad (5)$$

The y-component (represented by FIG. 410C) of a CP pulse is given by Equation (6):

$$B1_y(t) = B1\sin(\omega_{ref}t+\varphi_{p_2})e_y = 2b_1\sin(\omega_{ref}t+\varphi_{p_2})e_y. \quad (6)$$

Equations 5 and 6 combine to create a rotationally varying magnetic field (represented in FIG. 4 by 410A) given by Equation (7):

$$B1_{cp}(t) = B1\cos(\omega_{ref}t+\varphi_{p_1})e_x + B1\sin(\omega_{ref}t+\varphi_{p_2})e_y = 2b_1\cos(\omega_{ref}t+\varphi_{p_1})e_x + 2b_1\sin(\omega_{ref}t+\varphi_{p_2})e_y. \quad (7)$$

The CP pulse 410A is generated by firing two antennas simultaneously. The antennas are generally placed to be physically orthogonal to each other. The antennas should have $\pi/2$ radian phase difference, $\varphi_{p_1} - \varphi_{p_2} = \pi/2$, where a second antenna is fired at $\pi/2$ radian phase shift from a first antenna. This can be implemented by a phase change in the pulse or by delaying the second antenna by one-fourth of the wave period time.

Figure 5:
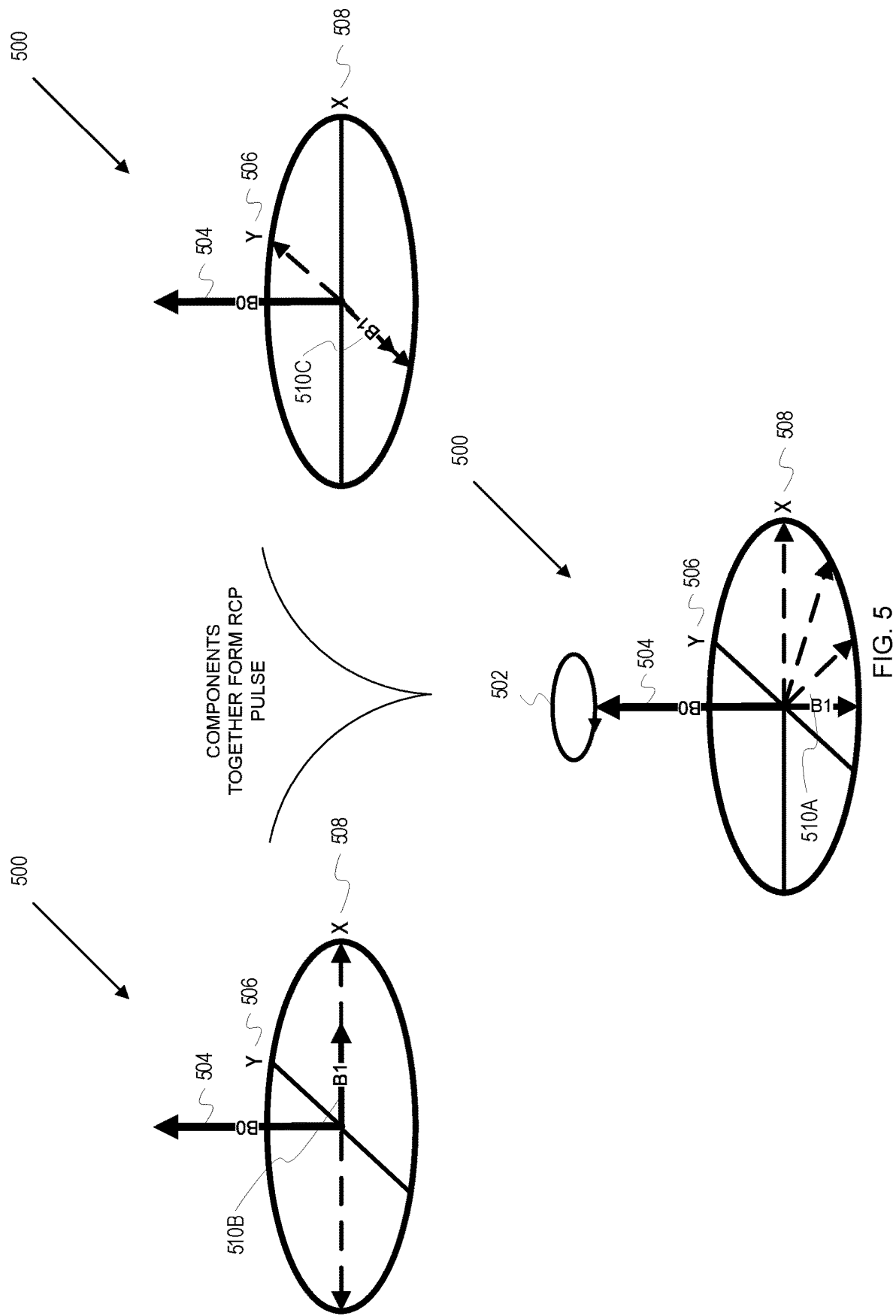
FIG. 5 depicts a constant static magnetic field, two linearly polarized oscillating magnetic fields along different axes during a dual antenna pulse, and a reverse circularly polarized oscillating magnetic field composed from the two linearly polarized oscillating magnetic fields.

FIG. 5 depicts a constant static magnetic field, two linearly polarized oscillating magnetic fields along different axes during a dual antenna pulse, and a reverse circularly polarized oscillating magnetic field composed from the two linearly polarized oscillating magnetic fields. FIG. 5 depicts a reference frame 500 that has a y-axis 506 and an x-axis 508. The x-axis 508 and y-axis 506 are perpendicular to a static magnetic field ($B_0$) 504, in the transversal plane to $B_0$.

A rotationally varying magnetic field ($B_1$) 510A, corresponds to an RCP pulse. The rotationally varying magnetic field 510A precesses about a circle in the x-y plane (as indicated by the dashed lines). The direction of rotation of the rotationally varying magnetic field 510A is indicated by arrow 502. Varying magnetic fields 510B, 510C oscillate along the x-axis 508 and the y-axis 506, respectively. With reference to FIG. 4, the varying magnetic field 510C is equivalent to the varying magnetic field 410C with a $\pi$ radian phase shift. The rotationally varying magnetic field 510A is composed by a summing of the two oscillating magnetic fields 510B and 510C. This is represented mathematically by Equations (8)-(10). A varying magnetic field is created by the combination of varying magnetic fields along separate axes. The component along the x-axis (represented in FIG. 5 by 510B) is given by Equation (8):

$$B1_x(t) = B1\cos(\omega_{ref}t+\varphi_{p_1})e_x = 2b_1\cos(\omega_{ref}t+\varphi_{p_1})e_x. \quad (8)$$

The component along the y-axis (represented in FIG. 5 by 510C) is given by Equation (9):

$$B1_y(t) = B1\sin(\omega_{ref}t+\varphi_{p_3})e_y = 2b_1\sin(\omega_{ref}t+\varphi_{p_1}+\pi)e_y = -2b_1\sin(\omega_{ref}t+\varphi_{p_1})e_y = 2b_1\sin(\omega_{ref}t+\varphi_{p_1}+\pi)e_y \quad (9)$$

Where $\varphi_{p_3} = \varphi_{p_1} + \pi$, or $\varphi_{p_1} - \varphi_{p_3} = \pi$.

Combining Equations (8) and (9) creates a varying magnetic field, that along with a static magnetic field, are components of an RCP pulse given by Equation (10):

$$B1_{rcp}(t) = B1\cos(\omega_{ref}t+\varphi_{p_1})e_x - B1\sin(\omega_{ref}t+\varphi_{p_2})e_y = 2b_1\cos(\omega_{ref}t+\varphi_{p_1})e_x - 2b_1\sin(\omega_{ref}t+\varphi_{p_2})e_y. \quad (10)$$

The rotationally varying magnetic field 510A is generated by firing two antennas simultaneously. To generate the components (510B, 510C) to create the RCP pulse, a second antenna is physically orthogonal from a first antenna. The second antenna is pulsed with a $3\pi/4$ radian phase shift from the first antenna. This can be implemented either by a phase change in the pulse or by delaying the second antenna by three-fourths of the wave period time.

Figure 6:
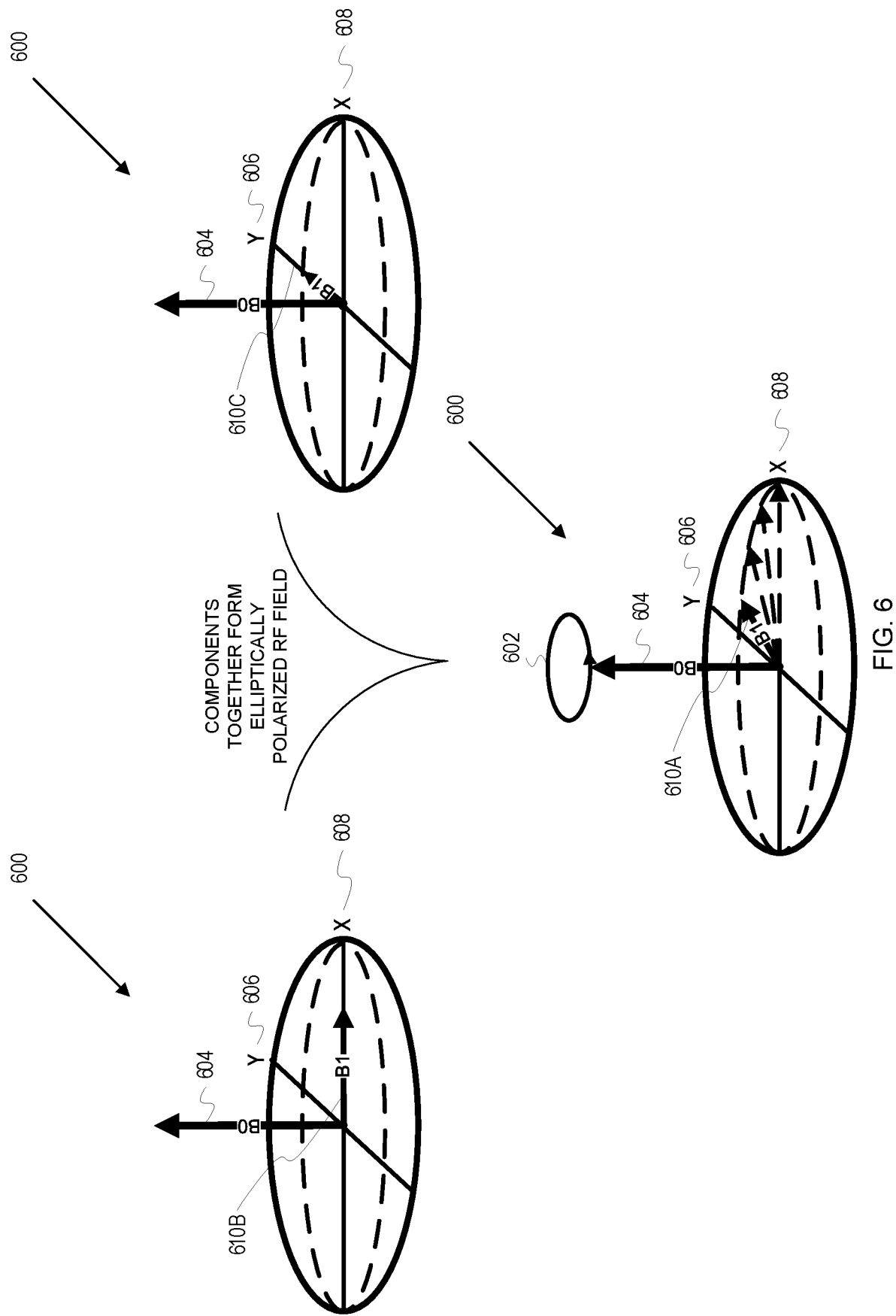
FIG. 6 depicts a constant static magnetic field, two linearly polarized oscillating magnetic fields along different axes during a dual antenna pulse, and elliptically polarized RF field results composed from the two linearly polarized oscillating magnetic fields.

FIG. 6 depicts a constant static magnetic field, two linearly polarized oscillating magnetic fields along different axes during a dual antenna pulse, and elliptically polarized RF field results composed from the two linearly polarized oscillating magnetic fields. FIG. 6 depicts a reference frame 600 that has a y-axis 606 and an x-axis 608. The x-axis 608 and y-axis 606 are perpendicular to a static magnetic field ($B_0$) 604, in the transversal plane to $B_0$. Rotation 602 represents a spin precession about the static magnetic field ($B_0$) 604 with an angular velocity equal to the Larmor frequency. An elliptically polarized varying magnetic field 610A precesses forward with respect to the rotation 602 (as indicated by the dashed lines) with an angular velocity greater than the Larmor frequency.

The elliptic polarization of the rotationally varying magnetic field 610A is due to a difference in pulse strength of x- and y-component pulses. A difference in pulse strength may be due to a difference in antenna output for quadrature antennas. For example, a first antenna along an x-axis 608 may produce a varying magnetic field 610B, which oscillates along the x-axis 608 with an amplitude of $b_1$. A second antenna along the y-axis 606 may produce a varying magnetic field 610C, which oscillates along the y-axis 606 with an amplitude of $b_1 - \Delta b_1$. Operating concurrently, the first and the second antennas would then produce an elliptically polarized rotationally varying magnetic field 610A. The rotationally varying magnetic field 610A is the composition of the x- and y-components, 610B and 610C, created from each antenna. The elliptically polarized varying magnetic field 610A is described by Equation (11):

$$B_{1,elliptical}(t) = 2b_1\cos(\omega_{ref}t+\varphi_p)e_x + 2(b_1 - \Delta b_1)\sin(\omega_{ref}t+\varphi_p)e_y \quad (11),$$

which is a combination of x- and y-components. The x- and y-components can readily be transformed into CP and RCP components as set forth above in the description of FIG. 4 and FIG. 5. A composition of the varying magnetic field 610A into CP and RCP components takes the form provided by Equation (12):

$$B_{1,elliptical}(t) = B'_{1,CP}(t) + B'_{1,RCP}(t) \quad (12),$$

where the CP component is given by Equation (13):

$$B'_{1,CP}(t) = (B_1 - \Delta b_1)\cos(\omega_{ref}t+\varphi_p)e_x + (B_1 - \Delta b_1)\sin(\omega_{ref}t+\varphi_p)e_y \quad (13),$$

with the RCP component given by Equation (14):

$$B'_{1,RCP}(t) = \Delta b_1\cos(\omega_{ref}t+\varphi_p)e_x - \Delta b_1\sin(\omega_{ref}t+\varphi_p)e_y \quad (14).$$

The nutation frequency of the elliptically polarized varying magnetic field 610A can be determined from the CP component of the elliptically polarized varying magnetic field 610A. Nutation frequency is given by Equation (15):

$$\omega_{nut} = -\gamma |B'_{1,CP}| \tag{15}$$

where $\omega_{nut}$ is nutation frequency, $\gamma$ is a gyromagnetic ratio, and $|B'_{1,CP}|$ is the magnitude of the CP component of the varying magnetic field 610A. By taking a ratio of nutation frequencies for the CP component of the varying magnetic field 610A and a CP pulse with a 90° nutation angle, the magnitudes of the two CP pulses can be used to find the nutation angle of the CP component of elliptically polarized pulses as given by Equation (16):

$$\frac{\omega'_{nut}}{\omega_{nut}} = \frac{|B'_{1,CP}|}{|B_{1,CP}|} = \frac{\theta'_{nut}}{\theta_{nut}}, \tag{16}$$

where $\omega'_{nut}$ is the nutation frequency of the CP component of the elliptically polarized pulse and $\theta'_{nut}$ is the nutation angle of the CP component of the elliptically polarized pulse. The ratio of the nutation angles for the CP pulses are equal to the ratio of nutation frequencies as the nutation angle is merely the nutation frequency multiplied by a time interval. For any equal time interval, the ratio of two nutation frequencies are equal to the ratio of two corresponding nutation angles.

With reference to FIG. 3, the nutation angle of the CP pulse described by Equation (3) is 90°. The magnitude of the CP pulse described by Equation (3) is known to be $b_1$ while the magnitude of the CP component of the varying magnetic field 610A is known to be $B_1 - \Delta b_1$ from Equation (13). Thus, the nutation angle of the CP component of the elliptically polarized pulse is given by Equation (17):

$$\theta'_{nut} = \left(\frac{B_1 - \Delta b_1}{B_1}\right)\frac{\pi}{2} \tag{17}$$

The nutation angle of the CP component of the varying magnetic field 610A thus relates the transverse magnetization induced by the CP component of the varying magnetic field 610A to the transverse magnetization induced by a CP 90° pulse. When measuring the free induction decay ("FID") of a CP component of an elliptically polarized pulse, the NMR signal corresponding to the CP component of the elliptically polarized pulse, denoted by M'(t), is measured. The time dependence of the induced transverse magnetization can be expressed by Equation (18):

$$M'(t) = M'_0 e^{\frac{-t}{T_2^*}}, \tag{18}$$

where M'(t) is the NMR signal of a CP component of the elliptically polarized pulse, $M_0'$ is the peak induced transverse magnetization, $T_2^*$ is the "effective" spin-spin relaxation time, and t is time. Measuring the FID of an NMR signal allows a reliable measurement of the induced transverse magnetization due to the known form of Equation (18). Multiple datapoints at different times for M'(t) can be used to determine $M_0'$ from Equation (18). The transverse magnetization induced by a CP component of the elliptically polarized pulse is related to the correct transverse magnetization $M_0$ by the nutation angle of the CP component of the elliptically polarized pulse, $\theta'_{nut}$. This relationship is given by Equation (19):

$$M' = M_0 \sin \theta'_{nut} \tag{19},$$

where M' is the peak induced transverse magnetization and $M_0$ is the correct transverse magnetization induced by the CP component of the varying magnetic field 610A. Performing accurate measurements of the correct transverse magnetization of a spin system induced by varying magnetic fields (in this case CP and RCP pulses) is a core objective of NMR logging. Because the varying magnetic field 610A is elliptically polarized, it is decomposed into CP and RCP pulses. RCP pulses induce little or no change in magnetization, so only the CP component of the elliptically polarized field 610A contributes to measured FID signals. In some cases, the peak induced magnetization may be measured using alternate NMR methods, such as a CPMG echo train or a Hahn Echo. Once the peak induced magnetization has been measured, Equations (17)-(19) can be used to determine the correct transverse magnetization based on the pulse amplitude of the CP component of a CP excitation pulse. An echo is calculated by measuring a response after a refocusing pulse from the formation using an antenna, which could be the excitation antenna. The measured the waveform signal is then filtered and summed into a single value called an Echo.

In some embodiments, the signal from one of the antennas may be reversed to produce a reverse elliptically polarized pulse. Specifically, using the varying magnetic field 610C with a negative amplitude in combination with the varying magnetic field 610B results in the generation of a reverse elliptically polarized pulse similar to the elliptically polarized pulse 610A. The reverse elliptically polarized pulse can be decomposed to derive a relationship between induced transverse magnetization and correct transverse magnetization similar to Equation (19). A reverse elliptically polarized pulse is given by Equation (20):

$$B_{1,reverse\ elliptical}(t) = B_1 \cos(\omega_{ref}t + \varphi_p)e_x - (B_1 - \Delta b_1)\sin(\omega_{ref}t + \varphi_p)e_y \tag{20}.$$

The reverse elliptically polarized pulse can be decomposed into a combination of CP and RCP components as given by Equation (21):

$$B_{1,RCP}^{imperfect}(t) = B''_{1,CP}(t) + B''_{1,RCP}(t) \tag{21},$$

where the CP component is given by Equation (22):

$$B''_{1,CP}(t) = (\Delta b_1)\cos(\omega_{ref}t + \varphi_p)e_x + (\Delta b_1)\sin(\omega_{ref}t + \varphi_p)e_y \tag{22},$$

with the RCP component given by Equation (23):

$$B''_{1,RCP}(t) = (B_1 - \Delta b_1)\cos(\omega_{ref}t + \varphi_p)e_x - (B_1 - \Delta b_1)\sin(\omega_{ref}t + \varphi_p)e_y \tag{23}.$$

The magnitudes of the CP and RCP components of the reverse elliptically polarized pulse are the same as those of the RCP and CP components of the elliptically polarized pulse 610A. As with Equations (15) and (16) above, the nutation angle of the CP component of the reverse elliptically polarized pulse is given by Equation (24):

$$\theta''_{nut} = \left(\frac{\Delta b_1/2}{b_1}\right)\frac{\pi}{2} = \frac{\pi}{2} - \theta'_{nut}. \tag{24}$$

The nutation angle of the CP component of the reverse elliptically polarized pulse thus relates the transverse magnetization induced by the CP component of the reverse elliptically polarized pulse to the transverse magnetization induced by a CP 90° pulse. When measuring the FID of a reverse elliptically polarized pulse, the NMR signal corresponding to the reverse elliptically polarized pulse, denoted by M"(t), is measured. The time dependence of the induced transverse magnetization can be expressed by the following relationship:

$$M''(t) = M_0'' e^{\frac{-t}{T_2^*}}, \quad (25)$$

where M"(t) is the NMR signal of a reverse elliptically polarized pulse, $M_0''$ is the peak induced transverse magnetization, $T_2^*$ is the "effective" spin-spin relaxation time, and t is time. Measuring the FID of an NMR signal allows a reliable measurement of the induced transverse magnetization due to the known form of Equation (25). Multiple datapoints at different times for M"(t) can be used to determine $M_0''$ from Equation (25). The transverse magnetization induced by a reverse elliptically polarized pulse is related to the correct transverse magnetization $M_0$ by the nutation angle of the CP component of a reverse elliptically polarized pulse, $\theta''_{nut}$. The relationship between the two nutation angles allows the following substitution to be made for the relationship between the correct transverse magnetization and the peak induced transverse magnetization as given by Equation (26):

$$M''=M_0 \sin \theta''_{nut}=M_0 \cos \theta'_{nut} \quad (26)$$

where M" is the total magnetization and $M_0$ is the transverse magnetization excited by the CP component of the reverse elliptically polarized pulse.

By using both an elliptically polarized pulse and a reverse elliptically polarized pulse, it is possible to recover $M_0$, the correct transverse magnetization induced by the two pulses. The correct transverse magnetization can be found by combining Equations (19) and (26) to derive Equation (27):

$$M_0=\sqrt{M'^2+M''^2} \quad (27).$$

The correct transverse magnetization can thus be determined from the transverse magnetizations induced by a CP excitation pulse and an RCP recovery pulse. This result may be taken as a general property of CP and RCP pulses generated by a quadrature antenna.

Example Applications

Some embodiments can be used in Carr, Purcell, Meiboom and Gill (CPMG) applications. For example, to initiate a CPMG cycle, the NMR logging tool applies a CP excitation pulse followed by a series of CP recovery pulses to generate a CPMG echo train. The excitation pulse is intended to be 90°, and the recovery pulse is intended to be 180°. The NMR logging tool may perform a similar CPMG cycle using an excitation RCP pulse. The NMR logging tool can measure the signal from the CPMG echo train between pulsing. In some embodiments, the measured signal amplitudes may be taken against calibrated values for pure water (acquired in a laboratory environment). NMR measurements can be given in units of the pure water signal, which readily provides hydrogen porosity values for any further NMR measurements.

Figure 7:
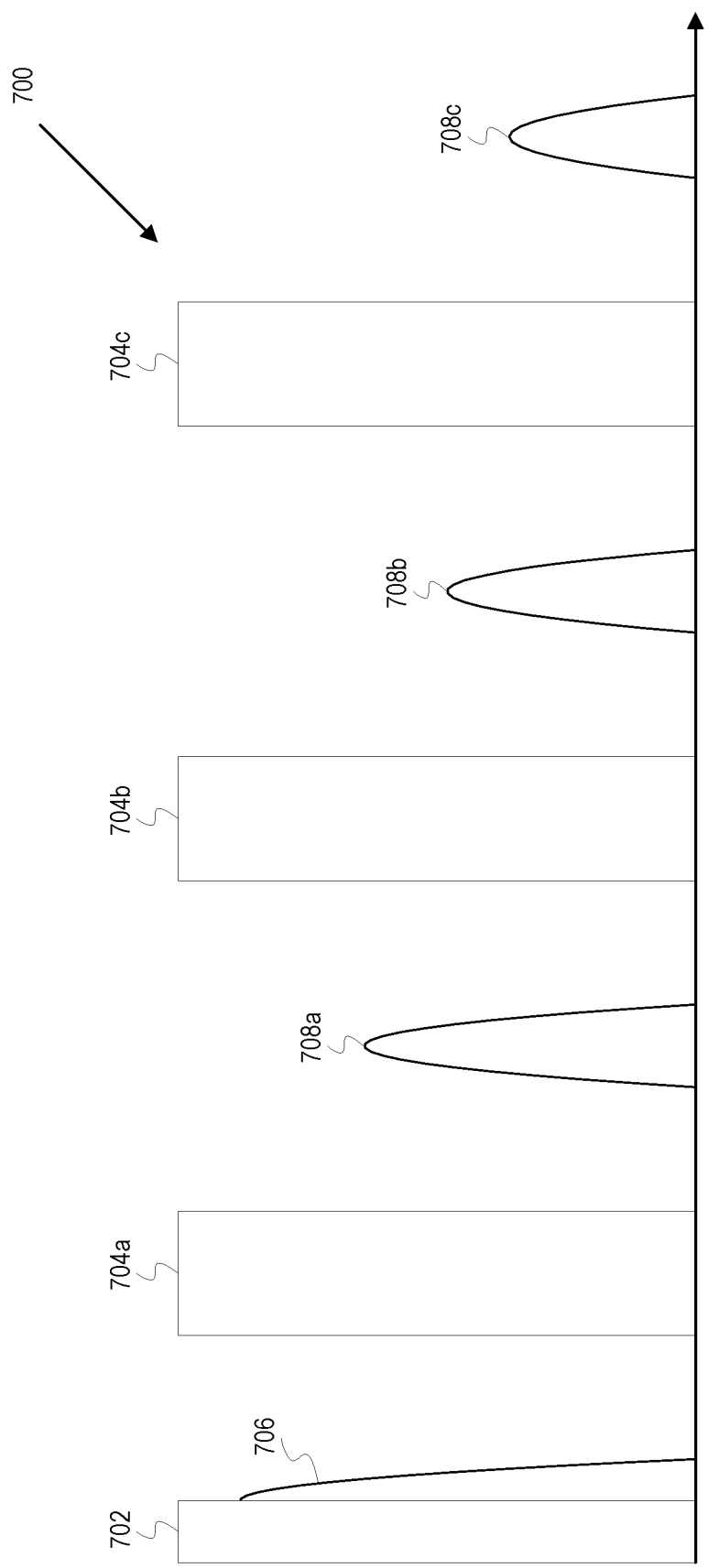
FIG. 7 depicts a CPMG echo train initiated with a CP excitation pulse, according to some embodiments.

FIG. 7 depicts a CPMG echo train initiated with a CP excitation pulse, according to some embodiments. A graph 700 includes an initial CP excitation pulse 702 and multiple CP recovery pulses 704a-c as well as an initial echo signal 706 and echo signals 708a-c. The initial CP excitation pulse 702 can be generated by a quadrature antenna. With reference to FIGS. 1 and 2, the NMR logging tools 190 and 200 are appropriate for generating a CPMG echo train.

Due to various factors and effects, the generated initial CP excitation pulse 702 may not be precisely a 90° pulse, which reduces the amplitude of the resulting initial echo signal 706. With reference to FIGS. 6A-6C, Equation (18) shows that the amplitude of an CP excitation pulse is diminished. By using a sequence of CP recovery pulses, a sequence of echo signals 708a-c can be generated. The generated echo signals 708a-c and the initial echo signal 706 form a CPMG echo train, from which an initial NMR signal amplitude can be generated. The NMR signal amplitude, $A_t'$, is diminished by inequality in transmission strength between quadrature antenna signals. With reference to FIG. 6, the CP excitation pulse 702 is elliptically polarized similar to the varying magnetic field 610A. The NMR signal amplitude $A_t'$ is used because the t is indicative of induced transverse magnetization. Thus, an FID measurement can be used to measure the CPMG echo train NMR signal amplitude $A_t'$.

Figure 8:
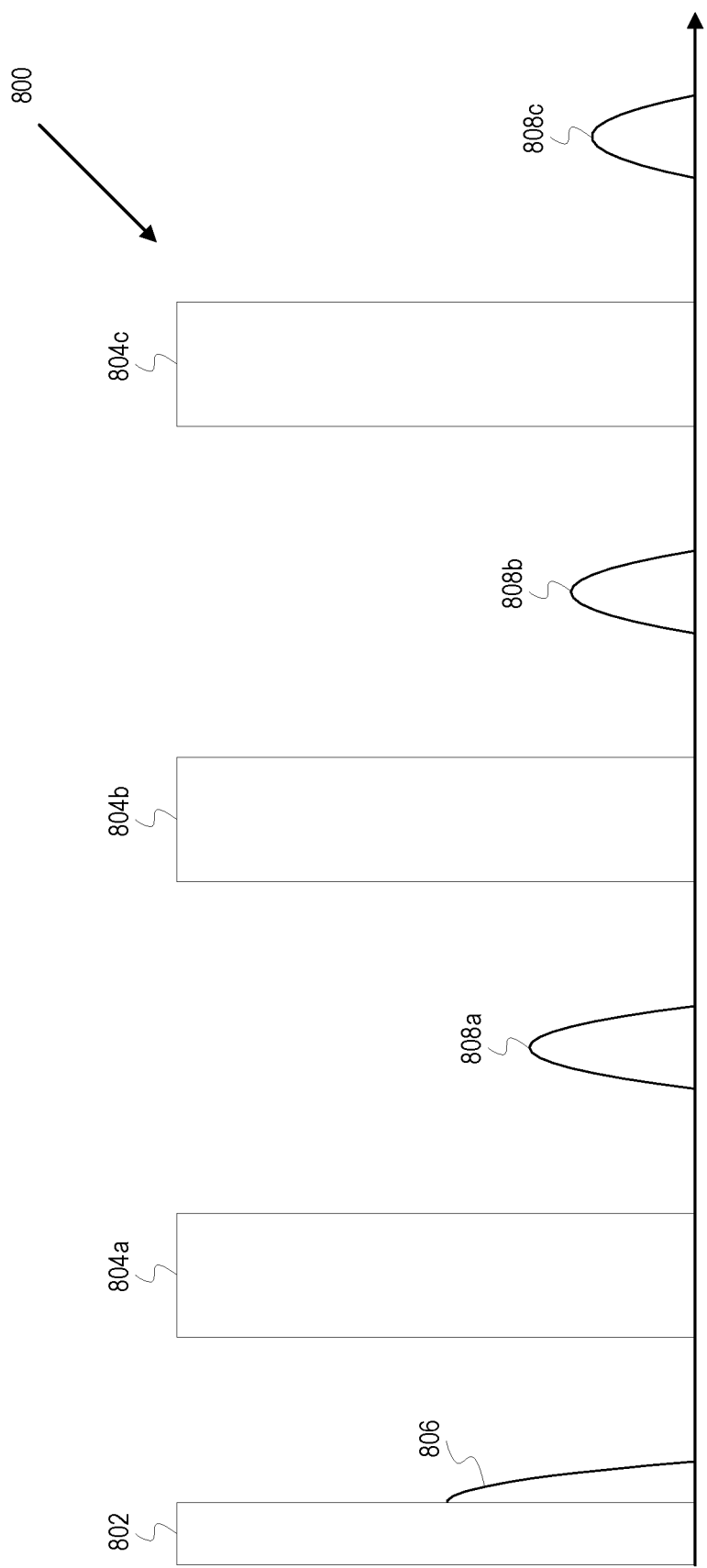
FIG. 8 depicts a CPMG echo train initiated with an RCP excitation pulse, according to some embodiments.

FIG. 8 depicts a CPMG echo train initiated with an excitation RCP pulse, according to some embodiments. A graph 800 includes an initial intended RCP 90° pulse 802 and multiple CP recovery pulses 804a-c as well as an initial echo signal 806 and echo signals 808a-c.

The initial RCP excitation pulse 802 can be generated by a quadrature antenna with unequal amplitudes. Thus, the generated initial excitation RCP pulse 802 is not precisely 90°, which increases the NMR signal amplitude of the resulting initial echo signal 806 (which would be negligibly small for an ideal 90° pulse). With reference to FIGS. 1 and 2, the NMR logging tools 190 and 200 are appropriate for generating a CPMG echo train. By using a sequence of CP recovery pulses 804a-c, a sequence of echo signals 808a-c can be generated. The generated echo signals 808a-c and the initial echo signal 806 form a CPMG echo train, from which an NMR signal amplitude can be measured. The NMR signal amplitude, $A_t''$, is increased by inequality in transmission strength between quadrature antenna signals. The initial RCP excitation pulse 802 is reverse elliptically polarized due to imperfections in the RCP pulse. With reference to FIG. 6, Equation (22) describes the CP component of a reverse elliptically polarized pulse similar to the RCP excitation pulse 802. The NMR signal amplitude $A_t''$ is used because it is indicative of induced transverse magnetization. Thus, an FID measurement can be used to measure the CPMG echo train NMR signal amplitude $A_t''$.

FIGS. 7 and 8 depict two CPMG echo trains resulting from an initiating CP excitation pulse 702 and an initiating RCP excitation pulse 802, respectively. The NMR signal amplitudes of each CPMG echo train are measured to determine the correct transverse magnetization over time. The correct NMR signal amplitude may be recovered analogously to Equation (27) above, as given by Equation (28):

$$A_t=\sqrt{A_t'^2+A_t''^2} \quad (28)$$

While signals measured by this process comprise a CPMG echo train signals based off of the initial CP excitation pulse 702 and an initial RCP excitation pulse 802, embodiments are not limited to CPMG echo trains. For example, as shown in FIG. 6, FID measurements may be used for an elliptically polarized pulse and a reverse elliptically polarized pulse. Operations detailed by FIGS. 9 and 10 allow the correction of signals from a quadrature antenna with unequal antenna signals without knowing the difference in signal strength.

Figure 9:
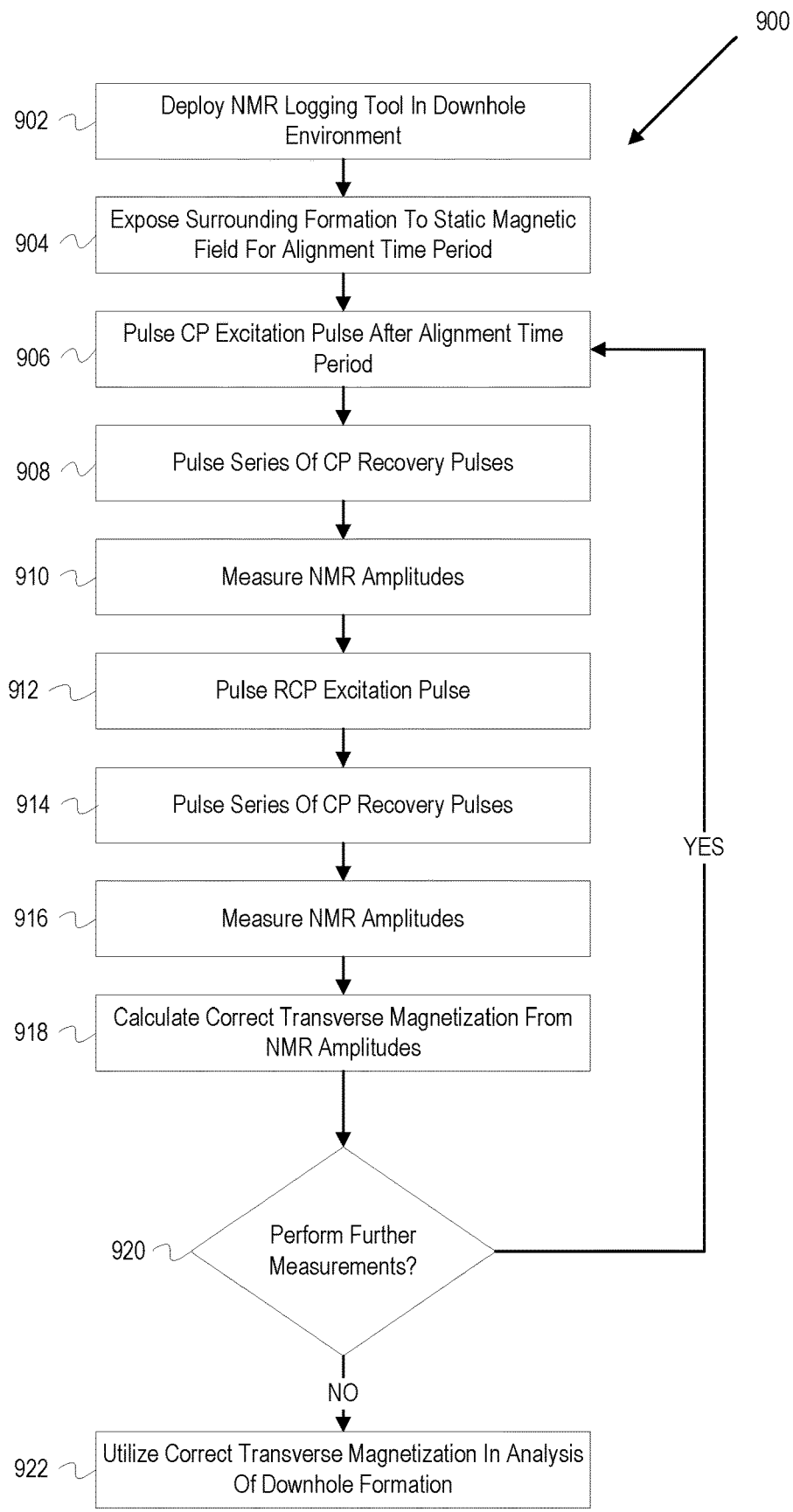
FIG. 9 depicts a flowchart of operations to operate an NMR logging tool with CP and RCP pulses, according to some embodiments.

FIG. 9 depicts a flowchart of operations to operate an NMR logging tool with CP and RCP pulses, according to some embodiments. FIG. 9 depicts a flowchart 900 that includes operations at blocks 902-922. These blocks represent stages of operations. Although these stages are ordered for this example, the stages illustrate one example to aid in understanding this disclosure and should not be used to limit the claims. Subject matter falling within the scope of the claims can vary with respect to the order and some of the operations.

Figure 12:
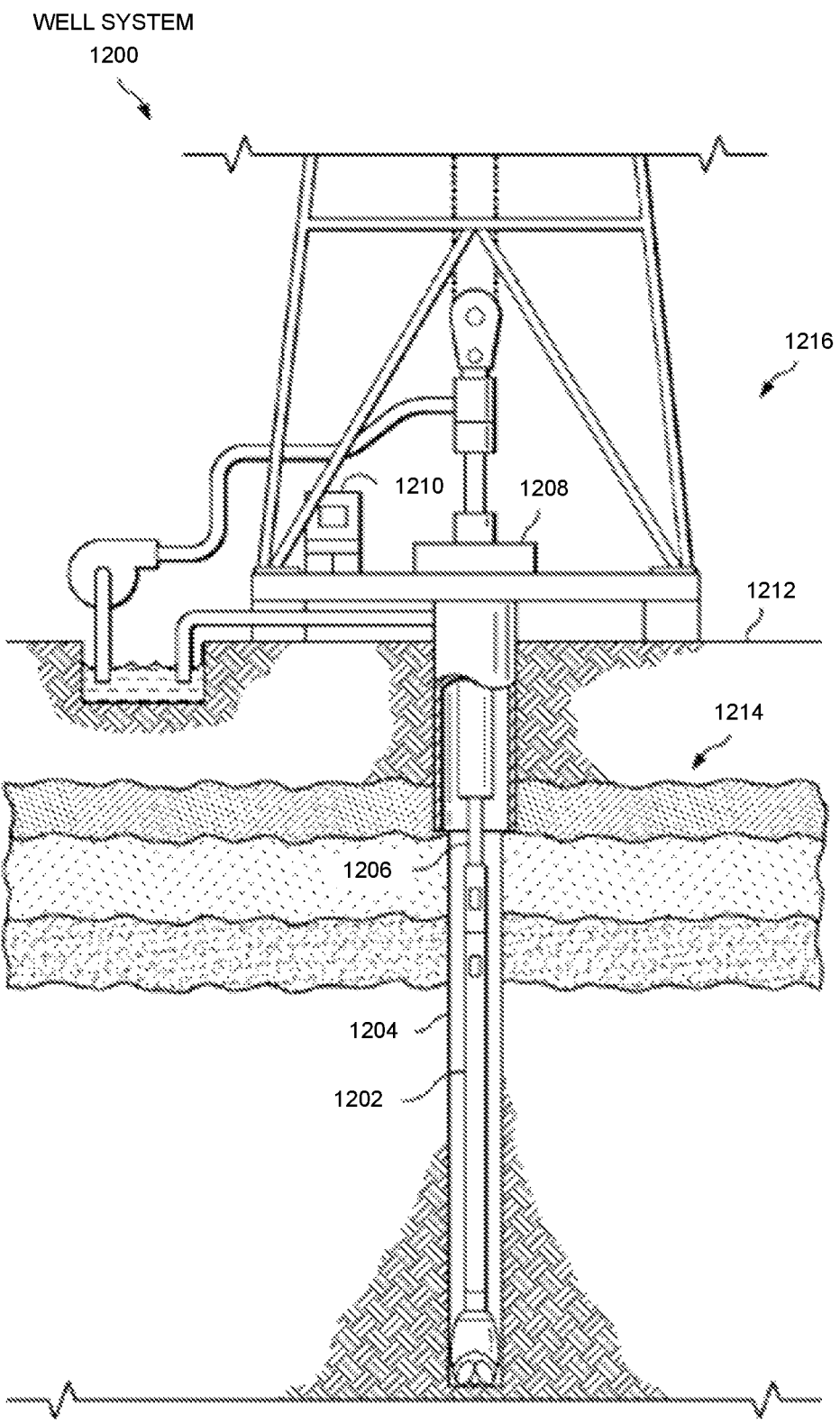
FIG. 12 depicts a drilling apparatus employing CP and RCP pulses to operate a downhole logging while drilling (LWD) NMR logging tool, according to some embodiments.
Figure 13:
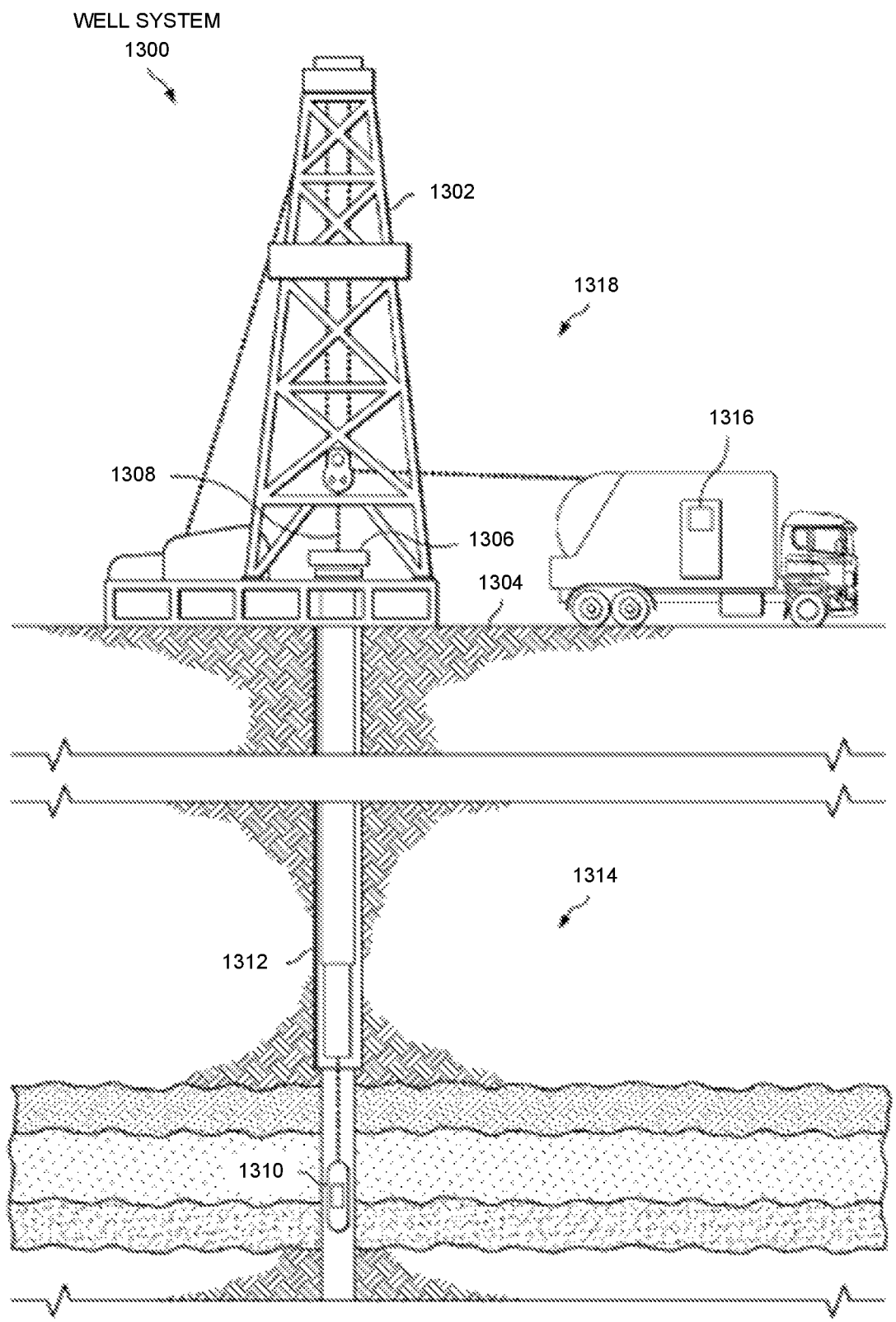
FIG. 13 depicts a wireline logging apparatus employing CP and RCP pulses to operate a downhole wireline NMR logging tool, according to some embodiments.

At block 902, an NMR logging tool is deployed in a downhole environment. For example, the NMR logging tool can be deployed as part of an LWD logging tool on a drill string during drilling. The NMR logging tool can also be deployed as part of a wireline operation. Examples of an NMR logging tool in an LWD operation and a wireline operation are depicted in FIG. 12 and FIG. 13, respectively, which are further described below.

At block 904, the NMR logging tool exposes the surrounding formation to a static magnetic field. Exposure to a static magnetic field polarizes formation substances (e.g., sedimentary layers, rock layers, sand layers, or other types of geologic formations or fluids, such as light or heavy oils, gas, etc., with nuclear magnetic spins greater than 0). The magnet(s) of the NMR logging tool produces a static magnetic field $B_0$.

At blocks 906 and 908, the NMR logging tool pulses a CP excitation pulse after a defined alignment time period followed by a series of recovery pulses. The recovery pulses are a series of CP 180° pulses. While in some cases it may be desirable for the alignment time period to be sufficient for the formation to be fully polarized, that is not always the case. The alignment time period can be a time period that is less than sufficient for full polarization. The CP excitation pulse polarizes the magnetization of formation substances transverse to the static magnetic field. The phrase "CP excitation pulse" refers to a varying magnetic field which has been distorted from an ideal CP 90° pulse by various factors and effects, such as the geometry of each coil, the positioning of coils in an antenna, the Q factor of each coil, the pulse amplitude, phase applied to each coil, B1 field gradient, etc. After being exposed to a varying magnetic field, the total magnetization of formation substances will have an induced magnetization component transverse to the static magnetic field. Over time, the total magnetization will decay towards the alignment of the static magnetic field. With reference to FIG. 6, this decay can be measured as an FID signal to determine the induced transverse magnetization, as described by Equation (12).

At block 910, the NMR logging tool measures NMR amplitudes. Measuring NMR amplitudes comprises measuring response signals indicative of transverse magnetization in formation substances. For example, signal amplitudes may be measured between pulses as in the CPMG example of FIG. 7. Measuring NMR amplitudes may comprise the use of various statistical methods to minimize noise and error. The measurement methodology may also vary between different implementations of the NMR logging tool. With reference to FIG. 7, CPMG measurements are considered for an appropriate NMR logging tool. For CPMG, multiple measurements may be used to fit an exponential curve and extrapolate the signal induced by each pulse. For FID, induced magnetization decays exponentially in time after an excitation CP pulse (generated at block 906). In the FID example, measuring the NMR amplitudes comprises acquiring a value for the peak induced transverse magnetizations by using Equation (17). After measuring the NMR amplitudes for the CP excitation pulse, operations of the flowchart 900 continue at block 912 to repeat the processes of blocks 906-910 for an RCP excitation pulse.

At blocks 912 and 914, the NMR logging tool pulses an RCP excitation signal followed by a series of recovery pulses. The recovery pulses can be a series of CP 180° pulses, but other pulse might be used which also produce echoes. Imperfections in the RCP excitation pulse will cause formation substances to be polarized transverse to the static magnetic field. The phrase "RCP excitation pulse" refers to a varying magnetic field which has been distorted from an ideal RCP 90° pulse by various factors and effects, such as the geometry of each coil, the positioning of coils in an antenna, the Q factor of each coil, the pulse amplitude, phase applied to each coil, B1 field gradient, etc. After being exposed to a varying magnetic field, the total magnetization of formation substances will have an induced magnetization component transverse to the static magnetic field. Over time, the total magnetization will decay towards the alignment of the static magnetic field. With reference to FIG. 6, this decay can be measured as an FID signal to determine the induced transverse magnetization, as described by Equation (25).

At block 916, the NMR logging tool measures NMR amplitudes. Measuring NMR amplitudes comprises measuring response signals indicative of transverse magnetization in formation substances. For example, signal amplitudes may be measured between pulses as in the CPMG example of FIG. 8. Measuring NMR amplitudes may comprise the use of various statistical methods to minimize noise and error. The measurement methodology may also vary between different implementations of the NMR logging tool. With reference to FIG. 8, CPMG measurements are considered for an appropriate NMR logging tool. For CPMG, multiple measurements may be used to fit an exponential curve and extrapolate the signal induced by each pulse. For FID, induced magnetization decays exponentially in time after an RCP excitation pulse (generated at block 912). In the FID example, measuring the NMR amplitudes comprises acquiring a value for the peak induced transverse magnetizations by using Equation (19).

Figure 10:
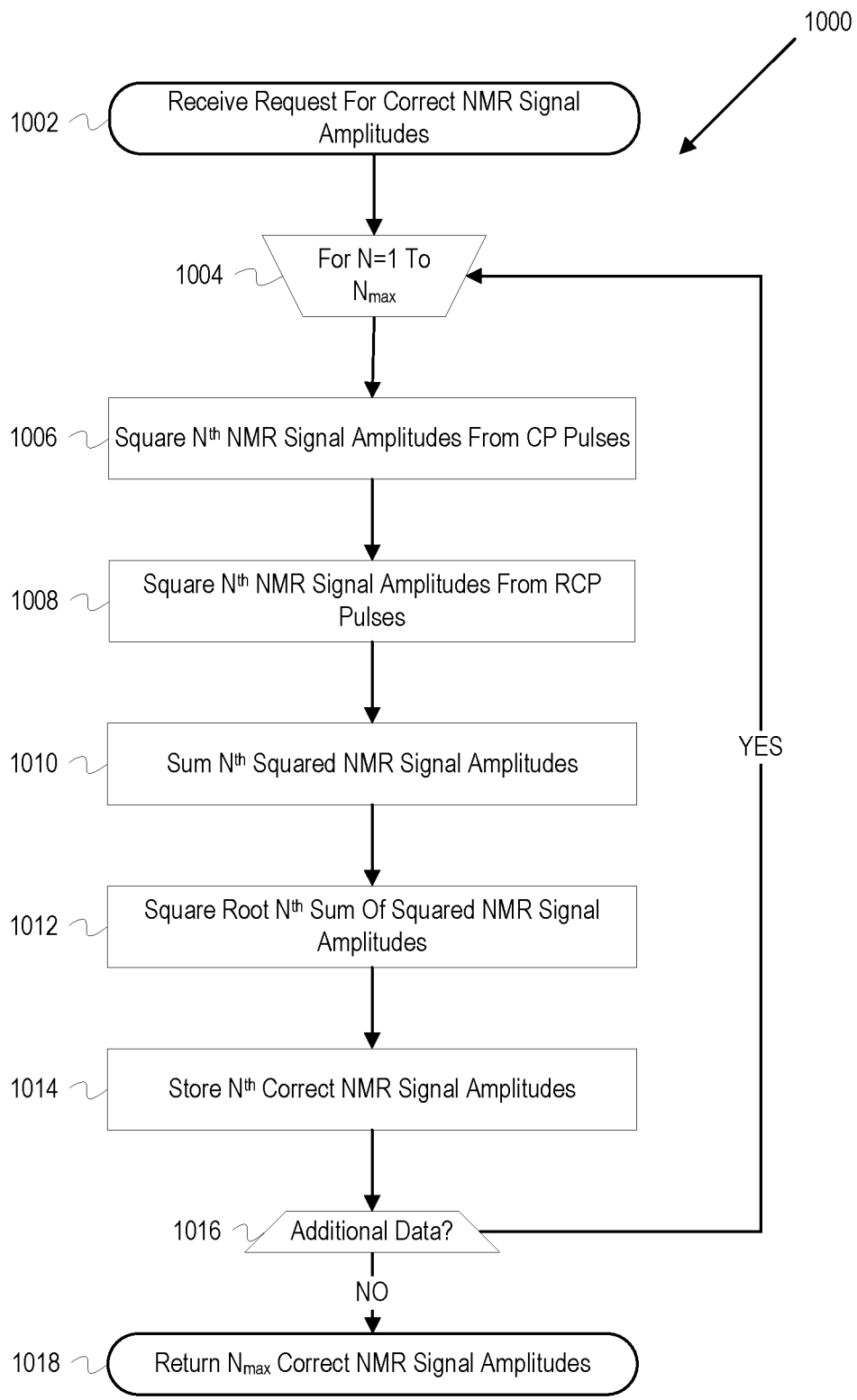
FIG. 10 depicts a flowchart of operations to calculate correct transverse magnetization with CP and RCP pulse amplitudes, according to some embodiments.

At block 918, the NMR logging tool calculates the correct transverse magnetization from NMR amplitudes. For different implementations of the NMR logging tool, the calculation of the correct transverse magnetization may vary. An example of calculating the correct transverse magnetization from NMR amplitudes is depicted in FIG. 10 (further described below). In some embodiments, a correct NMR signal amplitude may be calculated which corresponds to a correct transverse magnetization (e.g., for CPMG echo trains such as those of FIGS. 7 and 8) as discussed in the FIG. 6 descriptions. With reference to FIGS. 7 and 8, calculating a correct NMR signal amplitude may comprise determining and combining $A_t'$ and $A_t''$ values. By combining the NMR signal amplitudes induced by the initiating CP excitation pulse 706 and the initiating RCP excitation pulse 806, the correct NMR signal amplitude may be recovered using Equation (28).

At block 920, the NMR logging tool determines whether it will perform further measurements. If the NMR logging system performs further measurements, the flow of operations returns to block 906. If multiple measurements are performed, then a correct transverse magnetization will be determined for each set of measurements. If the NMR logging system does not perform further measurements, the flow of operations continues to block 922.

At block 922, the NMR logging tool utilizes the correct transverse magnetization(s) in analysis of the downhole formation. Based on the correct transverse magnetization(s) determined at block 918, the NMR logging tool can perform analysis of the downhole formation with regards to magnetic properties, hydrocarbon and fluid porosity, and the detection and identification of various formation materials. In some cases, the NMR logging tool may provide the correct transverse magnetization(s) determined at block 918 to another computer system for analysis. A second computer system may be located downhole with the NMR logging tool, on the surface with data transmit via data cables along the drill string or telemetry, or off-site with data transmit wirelessly over a network.

Example operations for determining a correct transverse magnetization from NMR logging data (see block 918) are now described. In particular, FIG. 10 depicts a flowchart of operations to calculate correct transverse magnetization with CP and RCP pulse amplitudes, according to some embodiments. Subject matter falling within the scope of the claims can vary with respect to the order and some of the operations. Operations of the flowchart 1000 can be performed by software, firmware, hardware or a combination thereof. For example, operations of the flowchart 100 can be performed by a processor executing program code or instructions.

At block 1002, a request for correct NMR signal amplitudes is received. This request may comprise a number of data points, each data point including one CP excitation pulse amplitude and one RCP excitation pulse amplitude. In certain embodiments, this request may be made from, to, or within a computer system. In other embodiments, the request may also be made from, to, or between processing units.

At block 1004, an operative loop is initiated and is iteratively performed based on a variable N, wherein N is initially set to 1 and is incremented to $N_{max}$. The value of $N_{max}$ denotes the number of data points to be processed. Each data point is a pair of NMR signal amplitudes acquired as a response from an CP excitation pulse and an RCP excitation pulse, respectively. N denotes the iteration within the iterative process to determine a correct NMR signal amplitude from each data point.

At block 1006, the $N^{th}$ NMR signal amplitude from CP pulses is squared. In some embodiments, the NMR signal amplitudes may correspond to different variables (e.g., magnetization, echo amplitudes, or Hahn echo amplitudes).

At block 1008, the $N^{th}$ NMR signal amplitude from RCP pulses is squared. In some embodiments, the NMR signal amplitudes may correspond to different variables (e.g., magnetization, echo amplitudes, or Hahn echo amplitudes). In some cases, the operations of block 1006 and block 1008 may be performed simultaneously, at least in part, by taking the dot product of each datapoint with itself to simultaneously square and sum the NMR signal amplitudes from CP pulses and RCP pulses.

At block 1010, the sum of the $N^{th}$ squared NMR signal amplitudes is taken. Summing the squared NMR signal amplitudes from CP excitation pulses and RCP excitation pulses combines the effect of each pulse on formation substances. An inequality in pulse strength between antennas in a quadrature antenna effectively shifts the ability to excite transverse magnetization in formation substances between CP excitation pulses and RCP excitation pulses.

At block 1012, the square root of the $N^{th}$ summed square NMR signal amplitudes is taken. Performing the operations of blocks 1006-1012 yields the $N^{th}$ correct NMR signal amplitude. In some embodiments, alternate algorithms may be used to find the square root of the $N^{th}$ summed square NMR signal amplitudes. For example, a binomial approximation may be used to approximate the square root of the $N^{th}$ summed square NMR signal amplitudes. The NMR signal amplitudes from the RCP pulses can be taken to be smaller than the NMR signal amplitudes from the CP pulses, allowing expansion of Equation (27) into Equation (29):

$$M_0 = M'\sqrt{1 + \left(\frac{M''}{M'}\right)^2} \approx M'\left(1 - \frac{M''}{2M'}\right). \tag{29}$$

For instances where higher precision is necessary, further terms may be used.

At block 1014, the $N^{th}$ correct NMR signal amplitude is stored. The $N^{th}$ correct NMR signal amplitude may be stored in one or more machine-readable media. In some embodiments, each of the $N_{max}$ correct NMR signal amplitudes may be stored as a component of an $N_{max}$-dimensional vector. The vector may then be used for analysis of the surrounding formation.

At block 1016, a determination is made of whether N is less than $N_{max}$. If N is less than $N_{max}$, operations of the flowchart 1000 return to block 1004 and N is incremented. Otherwise, if N is greater than or equal to $N_{max}$, operations of the flowchart 1000 continue at block 1018.

At block 1018, each of the $N_{max}$ correct NMR signal amplitudes is returned to the requester of the correct NMR signal amplitude values. Each stored correct NMR signal amplitude may be communicated locally or over a network to a separate computer system for analysis or modelling.

Example NMR Logging Systems

Figure 11:
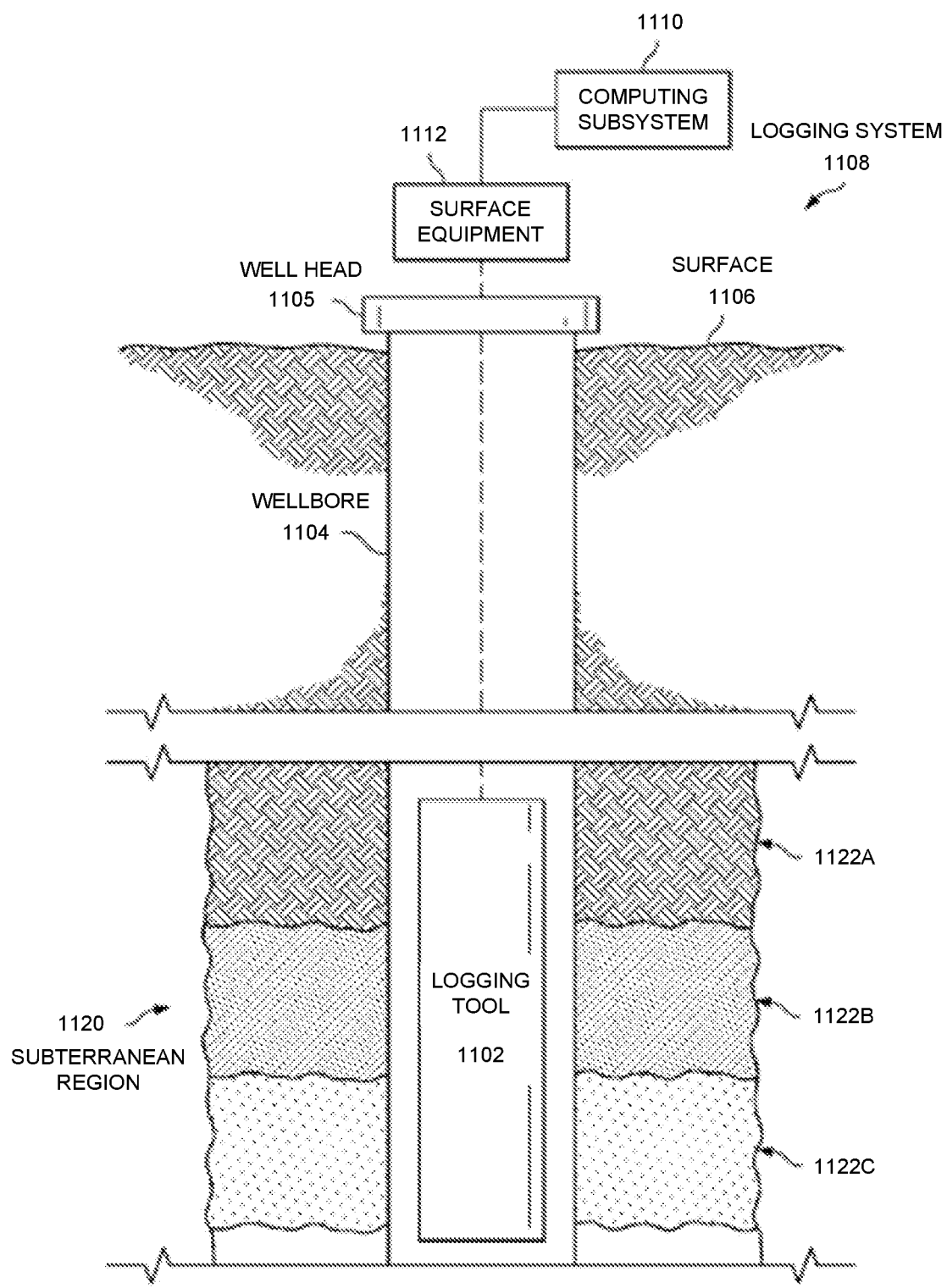
FIG. 11 depicts an NMR logging system employing CP and RCP pulses to measure NMR signals, according to some embodiments.

FIG. 11 depicts an NMR logging system employing CP and RCP pulses to measure NMR signals, according to some embodiments. An NMR logging system 1108 includes an NMR logging tool 1102 deployed in a wellbore 1104 and communicatively coupled to surface equipment 1112, which is in turn communicatively coupled to a computing subsystem 1110. The NMR logging tool 1102 is deployed through a well head 1105 at the surface 1106 and is in a subterranean region 1120 comprised of multiple geologic formations 1122A, 1122B, and 1122C. The NMR logging system 1108 may be included as a component of a larger downhole logging while drilling (LWD) system, wireline logging system, etc.

The surface equipment 1112 may include various equipment operating at the surface, such as an oil derrick, draw works, a computer system, etc. With reference to FIG. 13, the surface equipment 1318 is an appropriate example of surface equipment. The type and function of the surface equipment 1112 may depend upon the application of the NMR logging system 1108. The computing subsystem 1110 is depicted on the surface, but it may also be included on the NMR logging tool 1102 or communicatively coupled to the surface equipment 1112 over a network.

The subterranean region 1120 includes the geologic formations 1122A, 1122B, and 1122C, which may be sedimentary layers, rock layers, sand layers, or other types of geologic formations or fluids, such as light or heavy oils, gas, etc. The NMR logging tool 1102 may be raised or lowered within the wellbore 1104 to investigate each geologic formation 1122A, 1122B, and 1122C. The NMR logging tool 1102 may also be driven by a controller located on the tool, at the surface 1106, or as part of the computer system 1110. The controller may control pulse frequency, duration, and waveform for each antenna on the NMR logging tool 1102.

FIG. 12 depicts a drilling apparatus employing CP and RCP pulses to operate a downhole logging while drilling (LWD) NMR logging tool, according to some embodiments. An LWD system 1200 includes a derrick 1216 at the surface 1212 and an NMR logging tool 1202 on a drill string 1206 deployed in a wellbore 1204 with formations 1214. The derrick 1216 has a well head 1208 and a computer system 1210.

The NMR logging tool 1202 includes at least a quadrature antenna to produce CP and RCP pulses in the formations 1214. Using CP and RCP pulses, the NMR logging tool 1202 collects data on NMR signals which indicate characteristics of the formations 1214. Data from the NMR logging tool 1202 is communicated to the computer system 1210. In some embodiments, the computer system 1210 may be located at the surface 1212, integrated into the NMR logging tool 1202, or located elsewhere and fed data over a network or transferable media device.

FIG. 13 depicts a wireline logging apparatus employing CP and RCP pulses to operate a downhole wireline NMR logging tool, according to some embodiments. Surface equipment 1318 at the surface 1304 includes a wireline logging system 1300 with an oil derrick 1302, a wellhead 1306 and a wireline cable 1308. The oil derrick 1302 deploys an NMR logging tool 1310 in a borehole 1312 in a formation 1314.

The NMR logging tool 1310 includes at least a quadrature antenna to produce CP and RCP pulses in the formation 1314. Using CP and RCP pulses, the NMR logging tool 1310 collects data on NMR signals which indicate characteristics of the formation 1314. Data from the NMR logging tool 1310 is communicated to a computer system 1316. In some embodiments, the computer system 1316 may be located at the surface 1304, integrated into the NMR logging tool 1310, or located elsewhere and fed data over a network or transferable media device.

Example Computer

Figure 14:
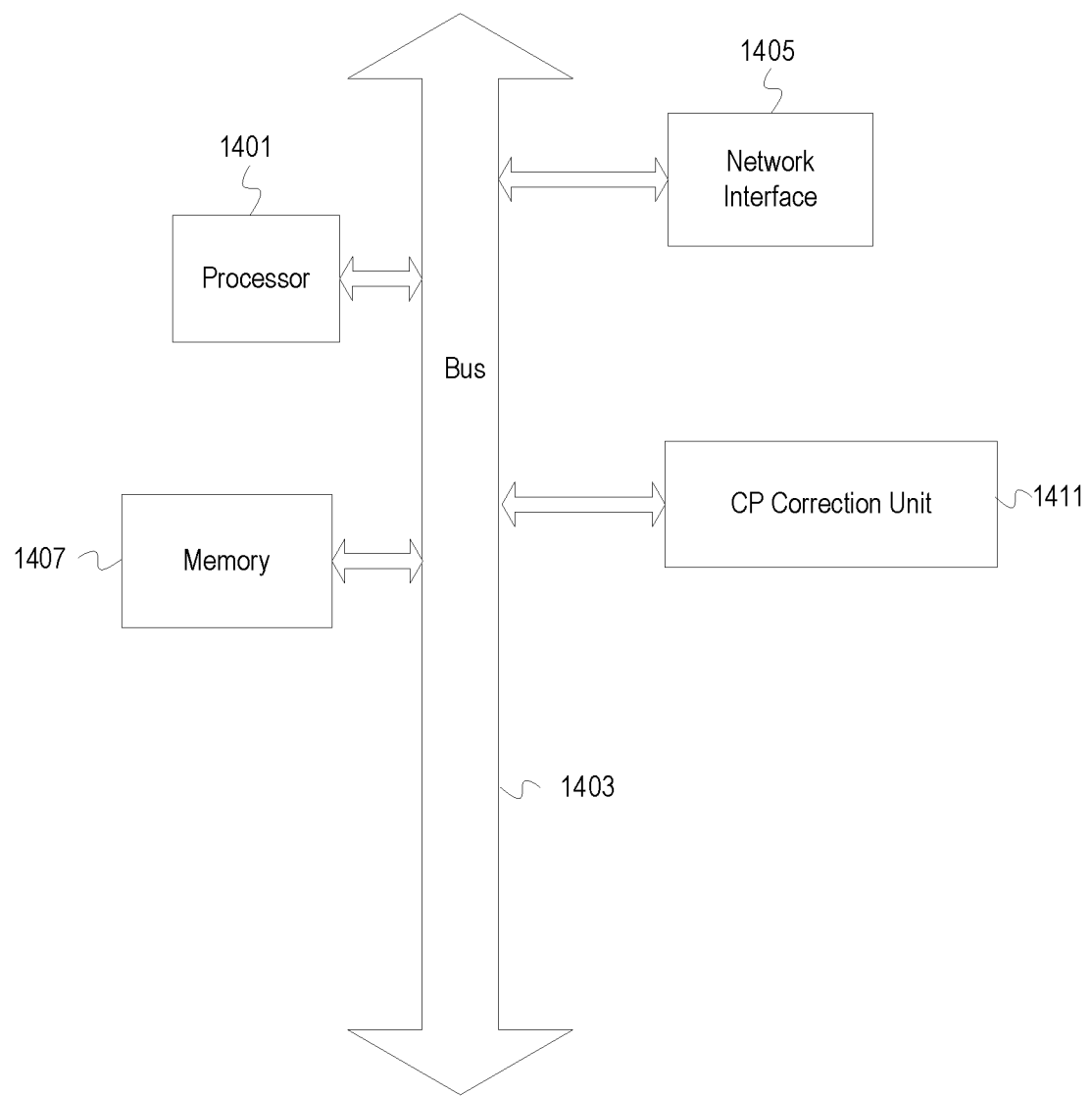
FIG. 14 depicts an example computer, according to some embodiments.

FIG. 14 depicts an example computer, according to some embodiments. A computer 1400 includes a processor 1401 (possibly including multiple processors, multiple cores, multiple nodes, and/or implementing multi-threading, etc.). The computer 1400 includes memory 1407. The memory 1407 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer 1400 also includes a bus 1403 (e.g., PCI, ISA, PCI-Express, HyperTransport® bus, InfiniBand® bus, NuBus, etc.) and a network interface 1405 (e.g., a Fiber Channel interface, an Ethernet interface, an internet small computer system interface, SONET interface, wireless interface, etc.).

The computer 1400 also includes an NMR data processor 1411. The NMR data processor 1411 can perform operations to correct NMR measurements made by an NMR logging tool which produces elliptically polarized and reverse elliptically polarized pulses (as described herein). The NMR data processor 1411 may be hardware, firmware, software or a combination thereof. For example, the NMR data processor 1411 may represent instructions executable by the processor 1401. Further, realizations may include fewer or additional components not illustrated in FIG. 14 (e.g., video cards, audio cards, additional network interfaces, peripheral devices, etc.). The processor 1401 and the network interface 1405 are coupled to the bus 1403. Although illustrated as being coupled to the bus 1403, the memory 1407 may be coupled to the processor 1401. The example computer 1400 is only one example of a data processing unit that can be utilized to determine or recover a correct NMR signal amplitude from NMR signal amplitudes corresponding to CP and RCP pulses, or determine or recover a correct transverse magnetization magnitude of an NMR signal from uncalibrated measurements. The data processing unit may be part of a logging tool or in communication with a logging tool.

Variations

Operations described herein in reference to Equations (1)-(28) and FIGS. 9 and 10 may be also applied to up hole tool calibration of quadrature antenna coupling, CP pulse quality, ringing level of the NMR logging tool, and electronic noise in the NMR logging system. For example, the ringing level of the NMR logging tool can be estimated and partially cancelled by using a phase alteration pulse.

Some embodiments described herein can also be utilized to validate down hole tool data and monitor performance of an NMR logging tool. For example, if an RCP pulse induces a response signal with greater magnitude than a CP pulse, the NMR logging tool may need significant calibration.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for collecting and processing NMR logging data as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

Example Embodiments

Example embodiments include the following:

A method for nuclear magnetic resonance (NMR) logging comprises probing, using an NMR logging tool, a formation surrounding a borehole with circularly polarized (CP) pulses and with reverse CP (RCP) pulses. A first NMR signal from the formation in response to the CP pulses and a second NMR signal from the formation in response to the RCP pulses are detected with a sensor of the NMR logging tool. A correct transverse magnetization value is recovered, based at least in part, on the first NMR signal and the second NMR signal.

Recovering the correct transverse magnetization value based, at least in part, on the first and the second NMR signals comprises combining the first NMR signal with the second NMR signal.

Combining the first and second NMR signals comprises calculating a sum of a square of an amplitude of the first NMR signal and a square of an amplitude of the second NMR signal.

Recovering the correct transverse magnetization value comprises determining a square root of the sum.

The method further comprises detecting the first NMR signal by measuring a Carr, Purcell, Meiboom and Gill echo train corresponding to the CP pulses and probing with the CP pulses by probing with a CP excitation pulse and CP refocusing pulses.

The method further comprises detecting the second NMR signal by measuring a Carr, Purcell, Meiboom and Gill echo train generated from probing with the RCP pulses and RCP refocusing pulses.

The method further comprises detecting the second NMR signal by measuring an echo corresponding to the either the CP or RCP pulses.

The method further comprises detecting the second NMR signal by measuring free induction decay (FID) corresponding to the either the CP or RCP pulses.

The method further comprises positioning the NMR logging tool in the borehole. The NMR logging tool has a quadrature antenna and a magnet.

The method further comprises estimating and cancelling ringing in the first and the second NMR signals with phase alteration pulse.

One or more non-transitory machine-readable storage media comprising program code to combine the pair of NMR signal amplitudes to generate a correct NMR signal amplitude for each pair of a plurality of pairs of nuclear magnetic resonance (NMR) signal amplitudes. A first NMR signal amplitude in each pair is a response acquired from a circularly polarized pulse from a logging tool in a borehole. A second NMR signal amplitude in each pair is a response acquired from a reverse circularly polarized pulse from the logging tool. The correct NMR signal amplitude is stored. One or more properties of a formation surrounding the borehole based, at least in part, on the correct NMR signal amplitudes are determined.

The program code to combine a pair of NMR signal amplitudes to generate a correct NMR signal amplitude comprises calculating the correct NMR signal amplitude as a square root of a sum of a square of the first NMR signal amplitude and a square of the second NMR signal amplitude.

The program code to combine a pair of NMR signal amplitudes to generate a correct NMR signal amplitude comprises computing a dot product of the first NMR signal amplitude and the second NMR signal amplitude.

The program code to combine a pair of NMR signal amplitudes to generate a correct NMR signal amplitude comprises calculating the correct NMR signal amplitude as a binomial approximation of a square root of a sum of a square of the first NMR signal amplitude and a square of the second NMR signal amplitude.

The machine-readable media further comprises an NMR signal amplitude corresponding to one of magnetization, an echo amplitude, or a Hahn echo amplitude.

The machine-readable media further comprising program code to control an antenna assembly of the logging tool to produce the circularly polarized pulses into the formation surrounding the borehole. The antenna assembly to produce the reverse circularly polarized pulses into the formation is controlled by the program code to control an antenna assembly.

The one or more properties at least comprise porosity.

A system comprises a magnet, an antenna assembly, a transmitter, and a controller that controls the transmitter to generate with the antenna assembly circularly polarized pulses and to generate reverse circularly polarized pulses after an alignment time that allows the magnet to polarize a formation. A sensor assembly detects a first echo train corresponding to the circularly polarized pulses and a second echo train corresponding to the reverse circularly polarized pulses. A data processing unit combines first nuclear magnetic resonance (NMR) signal amplitudes corresponding to the first echo train with second NMR signal amplitudes corresponding to the second echo train.

The magnet comprises a soft magnetic core and the antenna assembly comprises an integrated coil assembly wrapped around the soft magnetic core.

The controller controls the transmitter to generate the circularly polarized pulses with a circularly polarized pulse and the reverse circularly polarized pulses with a reverse circularly polarized pulse.

The magnet is a longitudinal-dipole magnet and the antenna assembly comprises a Transversal-dipole antenna.

The invention claimed is:

1. A method for nuclear magnetic resonance (NMR) logging comprising:
    probing, using an NMR logging tool, a formation surrounding a borehole with circularly polarized (CP) pulses and with reverse CP (RCP) pulses;
    detecting, with a sensor of the NMR logging tool, a first NMR signal from the formation in response to the CP pulses and a second NMR signal from the formation in response to the RCP pulses; and
    recovering a correct transverse magnetization value based, at least in part, on the first NMR signal and the second NMR signal.

2. The method of claim 1, wherein recovering the correct transverse magnetization value based, at least in part, on the first and the second NMR signals comprises combining the first NMR signal with the second NMR signal.

3. The method of claim 2, wherein combining the first and second NMR signals comprises calculating a sum of a square of an amplitude of the first NMR signal and a square of an amplitude of the second NMR signal.

4. The method of claim 3, wherein recovering the correct transverse magnetization value comprises determining a square root of the sum.

5. The method of claim 1, wherein detecting the first NMR signal comprises measuring a Carr, Purcell, Meiboom and Gill echo train corresponding to the CP pulses, wherein probing with the CP pulses comprises probing with a CP excitation pulse and CP refocusing pulses.

6. The method of claim 1, wherein detecting the second NMR signal comprises measuring a Carr, Purcell, Meiboom and Gill echo train generated from probing with the RCP pulses and RCP refocusing pulses.

7. The method of claim 1, wherein detecting the second NMR signal comprises measuring an echo corresponding to either the CP or RCP pulses.

8. The method of claim 1, wherein detecting the second NMR signal comprises measuring free induction decay (FID) corresponding to the either the CP or RCP pulses.

9. The method of claim 1 further comprising positioning the NMR logging tool in the borehole, the NMR logging tool having a quadrature antenna and a magnet.

10. The method of claim 1 further comprising estimating and cancelling ringing in the first and the second NMR signals with phase alteration pulse.

11. One or more non-transitory machine-readable storage media comprising program code to:
    for each pair of a plurality of pairs of nuclear magnetic resonance (NMR) signal amplitudes,
        combine the pair of NMR signal amplitudes to generate a correct NMR signal amplitude,
            wherein a first NMR signal amplitude in each pair is a response acquired from a circularly polarized pulse from a logging tool in a borehole,
            wherein a second NMR signal amplitude in each pair is a response acquired from a reverse circularly polarized pulse from the logging tool;
    store the correct NMR signal amplitude; and
    determine one or more properties of a formation surrounding the borehole based, at least in part, on the correct NMR signal amplitudes.

12. The machine-readable storage media of claim 11, wherein the program code to combine a pair of NMR signal amplitudes to generate a correct NMR signal amplitude comprises calculating the correct NMR signal amplitude as a square root of a sum of a square of the first NMR signal amplitude and a square of the second NMR signal amplitude.

13. The machine-readable storage media of claim 11, wherein the program code to combine a pair of NMR signal amplitudes to generate a correct NMR signal amplitude comprises computing a dot product of the first NMR signal amplitude and the second NMR signal amplitude.

14. The machine-readable storage media of claim 11, wherein the program code to combine a pair of NMR signal amplitudes to generate a correct NMR signal amplitude comprises calculating the correct NMR signal amplitude as a binomial approximation of a square root of a sum of a square of the first NMR signal amplitude and a square of the second NMR signal amplitude.

15. The machine-readable storage media of claim 11, wherein an NMR signal amplitude corresponds to one of magnetization, an echo amplitude, or a Hahn echo amplitude.

16. The machine-readable storage media of claim 11 further comprising program code to:
    control an antenna assembly of the logging tool to produce the circularly polarized pulses into the formation surrounding the borehole; and
    control the antenna assembly to produce the reverse circularly polarized pulses into the formation.

17. The machine-readable storage media of claim 11, wherein the one or more properties at least comprise porosity.

18. A system comprising:
    a magnet;
    an antenna assembly;
    a transmitter;
    a controller that controls the transmitter to generate with the antenna assembly circularly polarized pulses and to generate reverse circularly polarized pulses after an alignment time that allows the magnet to polarize a formation;

a sensor assembly that detects a first echo train corresponding to the circularly polarized pulses and a second echo train corresponding to the reverse circularly polarized pulses; and a data processing unit that combines first nuclear magnetic resonance (NMR) signal amplitudes corresponding to the first echo train with second NMR signal amplitudes corresponding to the second echo train.

19. The system of claim 18, wherein the magnet comprises a soft magnetic core and the antenna assembly comprises an integrated coil assembly wrapped around the soft magnetic core.

20. The system of claim 18, wherein the controller controls the transmitter to generate the circularly polarized pulses with a circularly polarized pulse and the reverse circularly polarized pulses with a reverse circularly polarized pulse.

* * * * *